(12) United States Patent
Kim et al.

(10) Patent No.: US 12,093,493 B2
(45) Date of Patent: Sep. 17, 2024

(54) DISPLAY DEVICE

(71) Applicant: Samsung Display Co., Ltd., Yongin-Si (KR)

(72) Inventors: Sunhwa Kim, Cheonan-si (KR); Hwan-Hee Jeong, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 484 days.

(21) Appl. No.: 17/531,853

(22) Filed: Nov. 22, 2021

(65) Prior Publication Data
US 2022/0291779 A1    Sep. 15, 2022

(30) Foreign Application Priority Data

Mar. 11, 2021 (KR) .................... 10-2021-0031937

(51) Int. Cl.
| | |
|---|---|
| *G06F 3/044* | (2006.01) |
| *H10K 59/131* | (2023.01) |
| *H10K 59/40* | (2023.01) |
| *H10K 59/88* | (2023.01) |

(52) U.S. Cl.
CPC ......... *G06F 3/0446* (2019.05); *H10K 59/131* (2023.02); *H10K 59/40* (2023.02); *H10K 59/88* (2023.02); *G06F 2203/04107* (2013.01)

(58) Field of Classification Search
CPC .......... G06F 3/0446; G06F 3/0443; G06F 2203/04107; G06F 3/04166; G06F 2203/04112; G06F 3/0412; G06F 3/04164; H10K 59/40; H10K 59/12; H10K 59/131
See application file for complete search history.

(56) References Cited

U.S. PATENT DOCUMENTS

| | | | |
|---|---|---|---|
| 10,275,106 B2 | 4/2019 | Kwak et al. | |
| 2012/0062486 A1* | 3/2012 | Rho | G06F 3/0443 |
| | | | 156/60 |
| 2020/0019281 A1* | 1/2020 | Miyamoto | G06F 3/0412 |
| 2020/0357857 A1* | 11/2020 | Park | G06F 3/0446 |
| 2021/0064188 A1* | 3/2021 | Lee | G06F 3/0448 |
| 2021/0064211 A1* | 3/2021 | Yang | G06F 3/0446 |
| 2021/0318770 A1* | 10/2021 | Joo | G06F 3/0446 |
| 2022/0100321 A1* | 3/2022 | Choi | H04M 1/0266 |

(Continued)

FOREIGN PATENT DOCUMENTS

| | | |
|---|---|---|
| KR | 10-2019-0006660 | 1/2019 |
| KR | 10-2019-0027993 | 3/2019 |
| KR | 10-2019-0034942 | 4/2019 |

*Primary Examiner* — Mamadou L Diallo
(74) *Attorney, Agent, or Firm* — F. CHAU & ASSOCIATES, LLC

(57) ABSTRACT

A display device including: a display panel including a display area and a plurality of pixels disposed in the display area; and an input sensing part disposed on the display panel, wherein the input sensing part includes an active area and a plurality of sensing electrodes disposed in the active area, a first distance between a 1-1 side of the active area and a 2-1 side of the display area is smaller than a second distance between a 1-2 side of the active area and a 2-2 side of the display area, the 1-1 side and the 2-1 side are adjacent to each other and the 1-2 side and the 2-2 side are adjacent to each other, and the 1-1 side and the 1-2 side are opposite to each other in a first direction, and the 2-1 side and the 2-2 side are opposite to each other in the first direction.

24 Claims, 20 Drawing Sheets

(56) References Cited

U.S. PATENT DOCUMENTS

| | | | |
|---|---|---|---|
| 2023/0113069 A1* | 4/2023 | Baek | H10K 50/858 257/91 |
| 2023/0255067 A1* | 8/2023 | Du | H10K 59/1201 257/40 |
| 2023/0284505 A1* | 9/2023 | Zhang | H10K 59/131 257/40 |
| 2024/0094839 A1* | 3/2024 | Kim | H10K 59/122 |

* cited by examiner

DISPLAY DEVICE

CROSS-REFERENCE TO RELATED APPLICATION

This U.S. non-provisional patent application claims priority under 35 U.S.C. § 119 to Korean Patent Application No. 10-2021-0031937, filed on Mar. 11, 2021, the disclosure of which is incorporated by reference herein in its entirety.

TECHNICAL FIELD

The present disclosure relates to a display device.

DISCUSSION OF RELATED ART

A display device is an output device for presentation of information in visual form. An electronic apparatus such as a smartphone, a digital camera, a notebook computer, a navigation device, or a smart television includes a display device for displaying an image to a user. The display device generates an image and provides the image to a user through a display screen.

The display device includes a display panel for generating an image and an input sensing part disposed on the display panel and for sensing an external input. The input sensing part may be a touch sensor used to detect and record physical touch. The input sensing part includes a plurality of sensing electrodes fix sensing the external input and sensing lines connected to the sensing electrodes.

SUMMARY

The present disclosure provides a display device in which an area in which sensing lines are to be disposed may be secured.

An embodiment of the inventive concept provides a display device including: a display panel that includes a display area and a plurality of pixels disposed in the display area; and an input sensing part disposed on the display panel, wherein the input sensing part includes an active area and a plurality of sensing electrodes disposed in the active area, wherein a first distance between a 1-1 side of the active area and a 2-1 side of the display area is smaller than a distance between a 1-2 side of the active area and a 2-2 side of the display area, wherein the 1-1 side and the 2-1 side are adjacent to each other and the 1-2 side and the 2-2 side are adjacent to each other, and the 1-1 side and the 1-2 side are opposite to each other in a first direction, and the 2-1 side and the 2-2 side are opposite to each other in the first direction.

An embodiment of the inventive concept provides a display device including: a display panel that includes a display area and a plurality of pixels disposed in the display area; and an input sensing part disposed on the display panel, wherein the input sensing part includes an active area and a plurality of sensing electrodes disposed in the active area, wherein the active area includes a 1-1 side and a 1-2 side opposite to each other in a first direction, and edges of the sensing electrodes adjacent to the 1-2 side are disposed farther from the display area than edges of the sensing electrodes adjacent to the 1-1 side.

An embodiment of the inventive concept provides a display device including: a display panel including a display area and a plurality of pixels disposed in the display area, wherein the display area includes first and second sides facing each other in a first direction, and third and fourth sides facing each other in a second direction crossing the first direction; and an input sensing part disposed on the display panel, wherein the input sensing part includes an active area and a plurality of sensing electrodes disposed in the active area, wherein the active area includes fifth and sixth sides facing each other in the first direction, and seventh and eighth sides facing each other in the second direction, wherein a first distance between the first side of the display area and the fifth side of the active area, which are adjacent to each other, is less than a second distance between the second side of the display area and the sixth side of the active area, which are adjacent to each other.

BRIEF DESCRIPTION OF THE FIGURES

Embodiments of the inventive concept will be more clearly understood from the following detailed description taken in conjunction with the accompanying drawings. In the drawings.

DETAILED DESCRIPTION OF THE EMBODIMENTS

Figure 1:
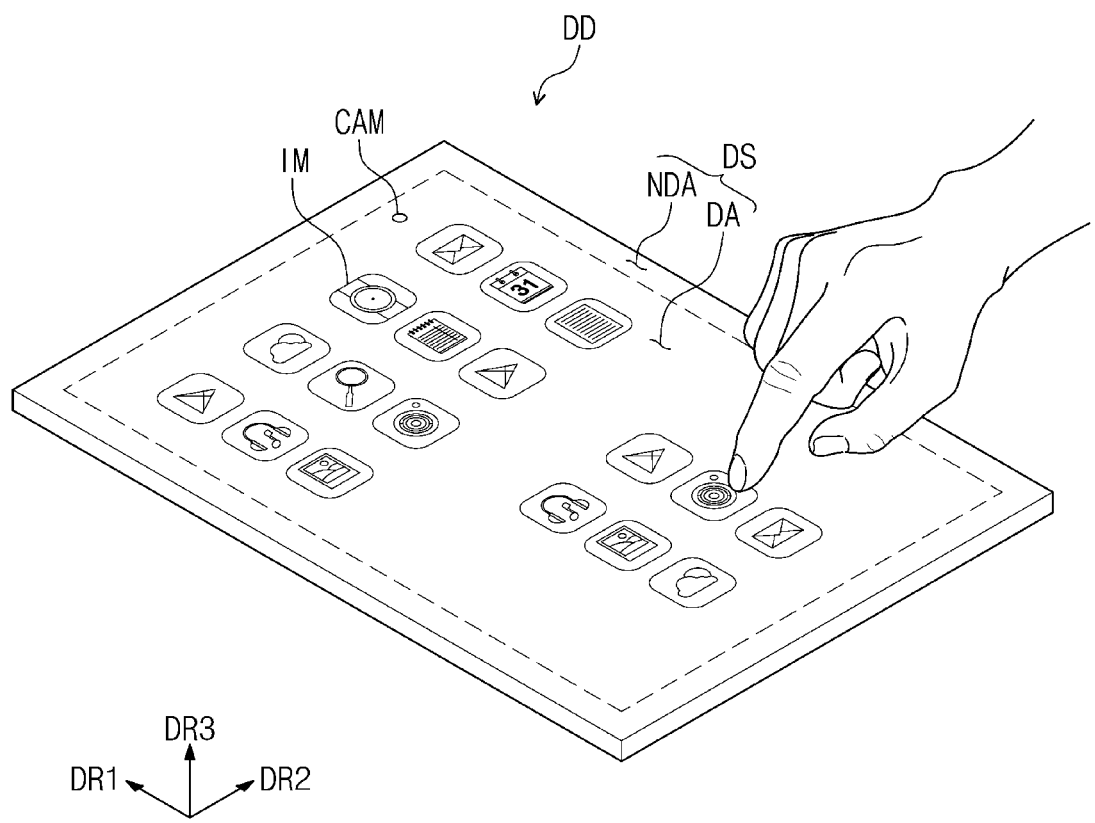
FIG. 1 is a perspective view of a display device according to an embodiment of the inventive concept.

It will be understood that when an element or layer is referred to as being "on", "connected to" or "coupled to"

another element or layer, it can be directly on, connected or coupled to the other element or intervening third elements may be present.

Like reference numerals in the drawings may refer to like elements. In addition, in the drawings, the thickness, the ratio and the dimension of the elements may be exaggerated. The term "and/or" includes any and all combinations of one or more of the associated items.

Terms such as first, second, and the like may be used to describe various components, but these components should not be limited by the terms. These terms are used to distinguish one element from another. For instance, a first component may be referred to as a second component, or similarly, a second component may be referred to as a first component. As used herein, the singular forms "a," "an," and "the" may be intended to include the plural forms as well, unless the context clearly indicates otherwise.

In addition, the terms such as "under", "lower", "on", and "upper" are used relationships of the elements illustrated in the drawings. It will be understood that the spatially relative terms are intended to encompass different orientations of the device in use or operation in addition to the orientation depicted in the figures.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which embodiments of the inventive concept belong. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described in detail with reference to the accompanying drawings.

FIG. 1 is a perspective view of a display device according to an embodiment of the inventive concept.

Referring to FIG. 1, the display device DD may have a rectangular shape having long sides extending in a first direction DR1 and short sides extending in a second direction DR2 intersecting with the first direction DR1. However, the display device DD is not limited hereto, and may have various shapes such as a circular shape or a polygonal shape. In addition, the display device DD may have curved edges.

Hereinafter, a direction, which substantially vertically crosses the plane formed by the first and second directions DR1 and DR2, is referred to as a third direction DR3. In addition, in the present specification, the phrase "when viewed on a plane" may refer to a state of a device when viewed in the third direction DR3.

The top surface of the display device DD may be referred to as a display surface DS, and have a plane formed by the first direction DR1 and the second direction DR2. Images IM generated in the display device DD may be provided to the user through the display surface DS.

The display surface DS may include a display area DA and a non-display area NDA around the display area DA. An image is displayed in the display area DA, but the image may not be displayed in the non-display area NDA. The non-display area NDA may surround the display area DA, and form an edge of the display device DD, which is printed in a prescribed color.

The display device DD may include at least one camera CAM. The camera CAM may be disposed in the display area DA. For example, the camera CAM may abut an upper side of the display area DA, but the position of the camera CAM is not limited thereto.

The display device DD may be used in a large electronic device such as a television, a monitor, or an outdoor billboard. In addition, the display device DD may be a small or medium-sized electronic device such as a personal computer, a notebook computer, a personal digital assistant, a vehicle navigator, a game console, a smartphone, a tablet, or, a camera, etc. However, these are just examples, and the display device DD may be employed in a variety of other electronic apparatuses.

Figure 2:
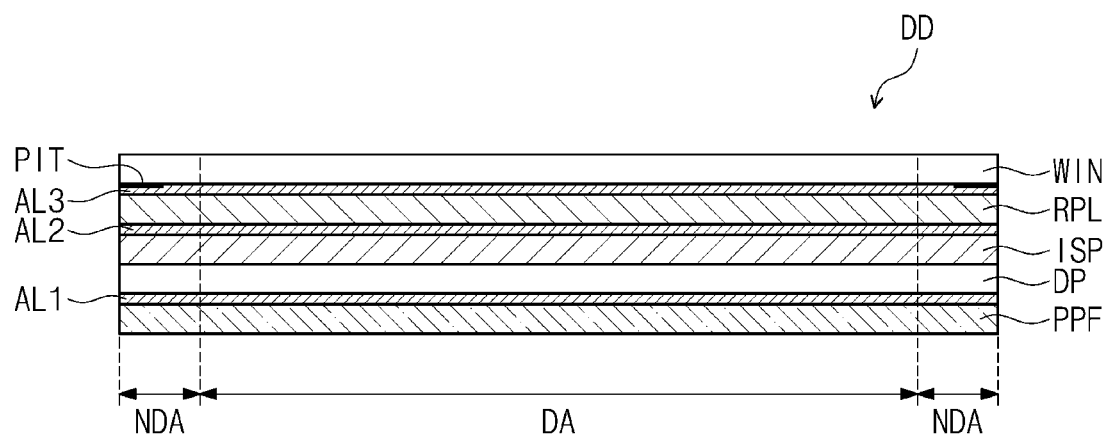
FIG. 2 illustrates a cross section of the display device shown in FIG. 1.
Figure 2:
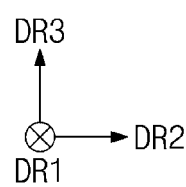

FIG. 2 illustrates a cross section of the display device shown in FIG. 1.

For example, FIG. 2 illustrates a cross section of the display device DD viewed in the first direction DR1.

Referring to FIG. 2, the display device DD may include a display panel DP, an input sensing part ISP, a reflection prevention layer RPL, a window WIN, a print layer PIT, a panel protection film PPF, and first, second and third adhesive layers AL1, AL2 and AL3.

The display panel DP may be a flexible display panel. The display panel DP may be an emissive display panel, and is not particularly limited thereto. For example, the display panel DP may be an organic light emitting display panel or an inorganic light emitting display panel. A light emission layer of the organic light emitting display panel may include an organic light emission material. A light emission layer of the inorganic light emitting display panel may include a quantum dot, a quantum rod, and the like. Hereinafter, the display panel DP will be described as an organic light emitting display panel.

The input sensing part ISP may be arranged on the display panel DP. For example, the input sensing part ISP may be disposed above the display panel DP. The input sensing part ISP may include a plurality of sensor units for sensing an external input in an electrostatic capacitive type. When manufacturing the display device DD, the input sensing part ISP may be manufactured directly on the display panel DP. However, the embodiment is not limited thereto, and the input sensing part ISP may be manufactured as a separate panel from the display panel DP, and may be attached to the display panel DP with an adhesive layer.

The reflection prevention layer RPL may be disposed on the input sensing part ISP. The reflection prevention layer RPL may be an external light reflection preventing film. The reflection prevention film RPL may reduce a reflection ratio of external light incident towards the display panel DP from the upside of the display device DD.

When the external light proceeding towards the display panel DP is reflected by the display panel DP to be provided again to an external user like a mirror, the user may visually recognize the external light. To prevent such a phenomenon, for example, the reflection prevention layer RPL may include a plurality of color filters by which the same color as that of the pixels of the display panel DP are displayed.

The color filters may filter the external light to obtain the same color as that of the pixels. In this case, the external light may not be visually recognized by the user. However, the present embodiment is not limited thereto, and the reflection prevention layer RPL may include a polarization film including a phase retarder and/or polarizer to reduce a reflection ratio of the external light.

The window WIN may be disposed on the reflection prevention layer RPL. The window WIN may protect the display panel DP, the input sensing part ISP, and the reflection prevention layer RPL from an external scratch or shock.

The print layer PIT may be disposed on the lower surface of the window WIN. The print layer PIT may overlap the non-display area NDA. The print layer PIT may be disposed on an outer side of the display area DA. The print layer PIT may be printed in a prescribed color to form the edge of the display device DD.

The panel protection film PPF may be disposed under the display panel DP. The panel protection film PPF may protect the lower part of the display panel DP. The panel protection film PPF may include a flexible plastic material such as polyethyleneterephthalate (PET).

The first adhesive layer AL1 may be disposed between the display panel DP and the panel protection film PPF. The display panel DP and the panel protection film PPF may be bonded by the first adhesive layer AL1.

The second adhesive layer AL2 may be disposed between the reflection prevention layer RPL and the input sensing part ISP. The reflection prevention layer RPL and the input sensing part ISP may be bonded by the second adhesive layer AL2.

The third adhesive layer AL3 may be disposed between the window WIN and the reflection prevention layer RPL. The window WIN and the reflection prevention layer RPL may be bonded by the third adhesive layer AL3. The print layer PIT may be attached to the reflection prevention layer RPL by the third adhesive layer AL3.

Figure 3:
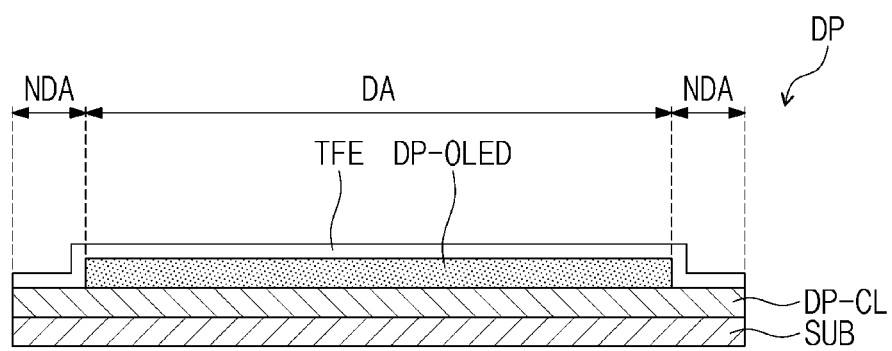
FIG. 3 illustrates a cross section of a display panel shown in FIG. 2.
Figure 3:
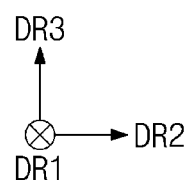

FIG. 3 illustrates a cross section of the display panel shown in FIG. 2.

For example, FIG. 3 shows the cross section of the display panel DP viewed in the first direction DR1.

Referring to FIG. 3, the display panel DP may include a substrate SUB, a circuit element layer DP-CL disposed on the substrate SUB, a display element layer DP-OLED disposed on the circuit element layer DL-CL, and a thin-film encapsulation layer TFE disposed on the display element layer DP-OLED.

The substrate SUB may include the display area DA and the non-display area NDA around the display area DA. The substrate SUB may include a flexible plastic material such as polyimide PI. The display element layer DP-OLED may be disposed on the display area DA.

A plurality of pixels may be arranged on the circuit element layer DP-CL and the display element layer DP-OLED. Each of the pixels may include a transistor disposed in the circuit element layer DP-CL and a light emitting element disposed in the display element layer DP-OLED and connected to the transistor. The configuration of a pixel will be described later.

The thin film encapsulation layer TFE may be disposed on the circuit element layer DP-CL to cover the display element layer DP-OLED. The thin-film encapsulation layer TFE may include inorganic layers and an organic layer between the inorganic layers. The inorganic layers may protect the pixels from moisture/oxygen. The organic layer may protect the pixels from a foreign matter such as a dust particle.

Figure 4:
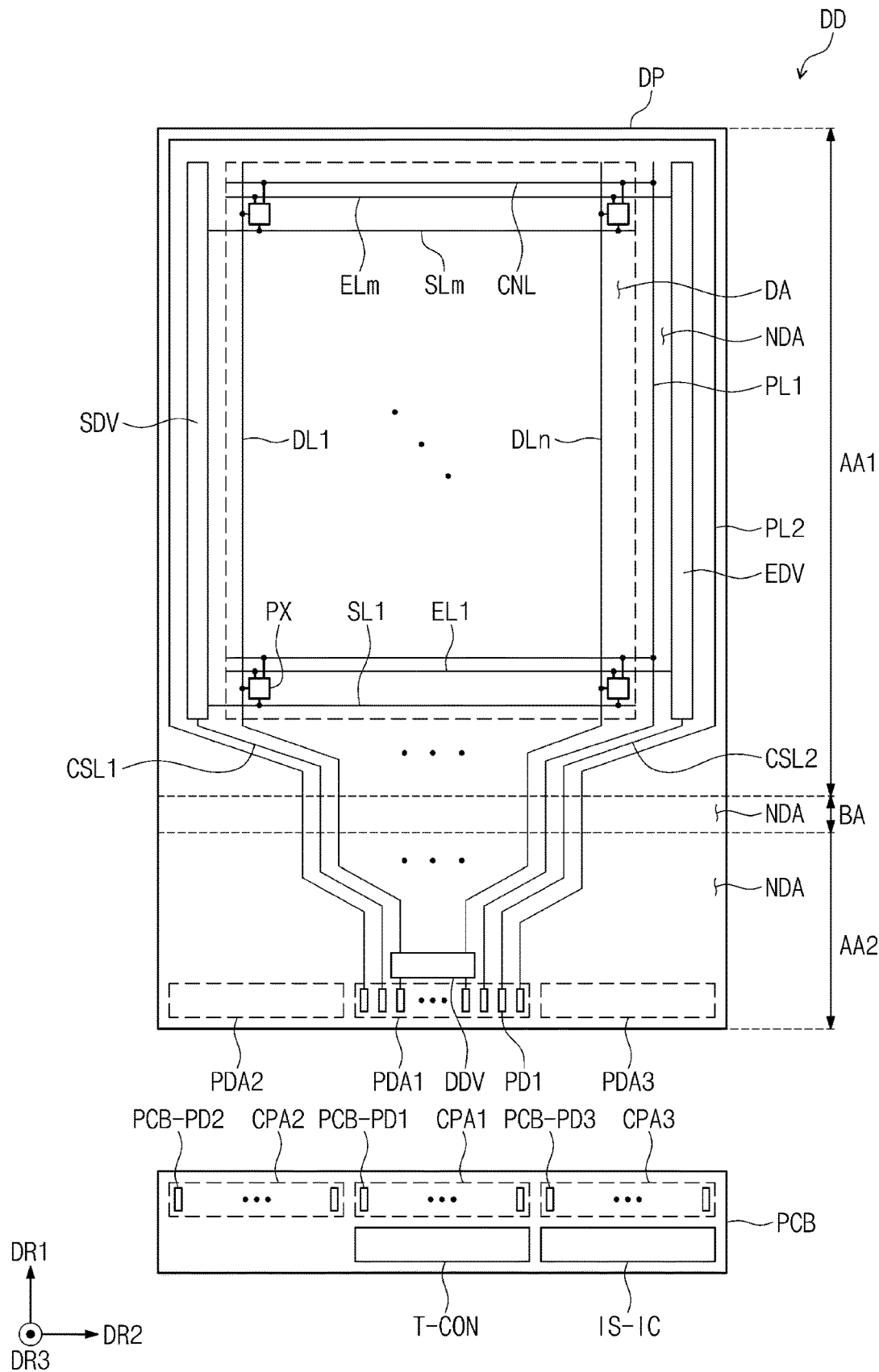
FIG. 4 is a plan view of the display panel shown in FIG. 2.

FIG. 4 is a plan view of the display panel shown in FIG. 2.

Referring to FIG. 4, the display device DD may include a display panel DP, a scan driver SDV, a data driver DDV, an emission driver EDV, a printed circuit board PCB, a timing controller T-CON, and an input sensing controller IS-IC.

The display panel DP may be a flexible display panel. The display panel DP may extend longer in the first direction DR1 than the second direction DR2. For example, the display panel DP may have a rectangular shape with long sides extending in the first direction DR1 and short sides extending in the second direction DR2.

The display panel DP may include a first area AA1, a second AA2, and a bending area BA disposed between the first area AA1 and the second area AA2. The first area AA1 may be larger than the second area AA2. The bending area BA extends in the second direction DR2, and the first area AA, the bending area BA, and the second area AA2 may be arranged in the first direction DR1.

The first area AA1 may have long sides extending in the first direction DR1 and opposite to each other in the second direction DR2. The first area AA1 may include the display area DA and the non-display area NDA around the display area DA. The non-display area NDA may surround the display area DA. The display area DA may be an area in which an image is displayed, and the non-display area NDA may be an area in which the image is not displayed.

The second area AA2 and the bending area BA may be areas in which the image is not displayed. The second area AA2 and the bending area BA may be the non-display area NDA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, connection lines CNL, and a plurality of first pads PD1. Here, m and n are natural numbers. The pixels PX may be disposed on the display area DA, and connected to the scan lines SL1 to SLm, the data lines DL1 to DLn, and the emission lines EL1 to ELm The scan driver SDV and the emission driver EDV may be disposed in the non-display area NDA. Each of the scan driver SDV and the emission driver EDV may be disposed in the non-display area NDA adjacent to the long sides of the first area AA1. The data driver DDV may be disposed in the second area AA2. The data driver DDV may be manufactured in an integrated circuit chip and mounted on the second area AA2.

The scan lines SL1 to SLm may extend in the second direction DR2 to be connected to the scan driver SDV. The data lines DL1 to DLn extend in the first direction DR1 in the first area AA1, and extend to the second area AA2 via the bending area BA to be connected to the data driver DDV. The emission lines EL1 to ELm may extend in the second direction DR2 to be connected to the emission driver EDV.

The first power line PL1 may extend in the first direction DR1 to be disposed in the non-display area NDA. The first power line PL1 may be disposed between the display area DA and the emission driver EDV. However, the embodiment is not limited thereto, and the first power line PL1 may also be disposed between the display area DA and the scan driver SDV.

The first power line PL1 may extend to the second area AA2 via the bending area BA. For example, the first power line PL1 may extend along a similar path as an adjacent one of the data lines DL1 to DLn. The first power line PL1 may extend toward the lower end of the second area AA2 when viewed on a plane. The first power line PL1 may receive a first voltage.

The second power line PL2 may be disposed in the non-display area NDA adjacent to the long sides of the first area AA1, and the non-display area NDA facing the second area AA2 with the display area DA therebetween. In other words, the second power line PL1 may extend in the first direction DR1 along the outer side of the emission driver EDV to an upper edge of the display panel DP, extend in the second direction DR2 to the scan driver SDV and then extend in the first direction DR1 along the outer side of the scan driver SDV. The second power line PL2 may be disposed closer to the outer side of the display panel DP than the scan driver SDV and the emission driver EDV.

The second power line PL2 may extend to the second area AA2 via the bending area BA. The second power line PL2 may extend in the first direction DR1 from the second area AA2 with the data driver DDV therebetween. When viewed on a plane, the second power line PL2 may extend toward the lower end of the second area AA2.

The second power line PL2 may receive a second voltage having a lower level than the first voltage. The second power line PL2 may also extend to the display area DA to be connected to the pixels PX, and the second voltage may be provided to the pixels PX through the second power line PL2.

The connection lines CNL may extend in the second direction DR2 and be arranged in the first direction DR1. The connection lines CNL may be connected to the first power line PL1 and the pixels PX. The first voltage may be applied to the pixels PX through the first power line PL1 and the connection lines CNL that are connected to each other.

The first control line CSL1 may be connected to the scan driver SDV, and extend to the lower end of the second area AA2 via the bending area BA. The second control line CSL2 may be connected to the emission driver EDV and extend to the lower end of the second area AA2 via the bending area BA. The data driver DDV may be disposed between the first control line CSL1 and the second control line CSL2.

A first pad area PDA1, a second pad area PDA2, and a third pad area PDA3 may be provided in a portion of the second area AA2, which is adjacent to the lower end of the second area AA2. The first, second and third pad areas PDA1, PDA2, and PDA3 may extend and be arranged in the second direction DR2. The first pad area PDA1 may be disposed between the second pad area PDA2 and the third pad area PDA3. For example, the first pad area PDA1 may be closer to the data driver DDV than the second and third pad areas PDA2 and PDA3.

The first pads PD1 may be disposed in the first pad area PDA1. The data driver DDV, the first power line PL1, the second power line PL2, the first control line CSL1, and the second control line CSL2 may be connected to the first pads PD1. In particular, the first power line PL1, the second power line PL2, the first control line CSL1, and the second control line CSL2 may be directly connected to the first pads PD1.

The data lines DL1 to DLn may be connected to the corresponding first pads PD1 through the data driver DDV. For example, the data lines DL1 to DLn may be connected to the data driver DDV and the data driver DDV may be connected to the first pads PD1 that respectively correspond to the data lines DL1 to DLn.

The timing controller T-CON and the input sensing controller IS-IC may be disposed on the printed circuit board PCB. Each of the timing controller T-CON and the input sensing controller IS-IC may be manufactured in an integrated circuit chip to be mounted on the printed circuit board PCB.

First connection pad area CPA1, a second connection pad area CPA2, and a third connection pad area CPA3 may be provided in a portion of the printed circuit board PCB, the portion being adjacent to one side of the printed circuit board PCB. The first, second and third connection pad areas CPA1, CPA2, and CPA3 may extend and be arranged in the second direction DR2. The first connection pad area CPA1 may be disposed between the second connection pad area CPA2 and the third connection pad area CPA3. The first connection pad area CPA1 may be aligned with the first pad area PDA1.

First connection pads PCB-PD1 may be disposed in the first connection pad area CPA1, second connection pads PCB-PD2 may be disposed in second connection pad area CPA1, and third connection pads PCB-PD3 may be disposed in the third connection pad area CPA2. The first pads PD1 may be connected to the first connection pads PCB-PD1. The first connection pads PCB-PD1 may be connected to the timing controller T-CON. The second connection pads PCB-PD2 and the third connection pads PCB-D3 may be connected to the input sensing controller IS-IC.

The timing controller T-CON may control the operations of the scan driver SDV, the data driver DDV, and the emission driver EDV. The timing controller T-CON may generate a scan control signal, a data control signal, acid an emission control signal in response to control signals received externally.

The scan control signal may be provided to the scan driver SDV through the first control line CSL1. The emission control signal may be provided to the emission driver EDV through the second control line CSL2. The data control signal may be provided to the data driver DDV. The timing controller T-CON may receive image signals externally, convert a data format of the image signals to match the specification of an interface with the data driver DDV, and provide the converted signals to the data driver DDV.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate a plurality of data voltages corresponding to the image signals in response to the data control signal. The data voltages may be applied to the pixels through the data lines DL1 to DLn. The emission driver EDV may generate a plurality of emission signals in response to the emission control signal. The light emission signals may be applied to the pixels PX through the light emission lines EL1 to ELm.

The pixels PX may receive data voltages in response to the scan signals. The pixels PX may display an image by emitting light of the brightness corresponding to the data voltages in response to the emission signals. An emission time of the pixels PX may be controlled by the emission signals.

Figure 5:
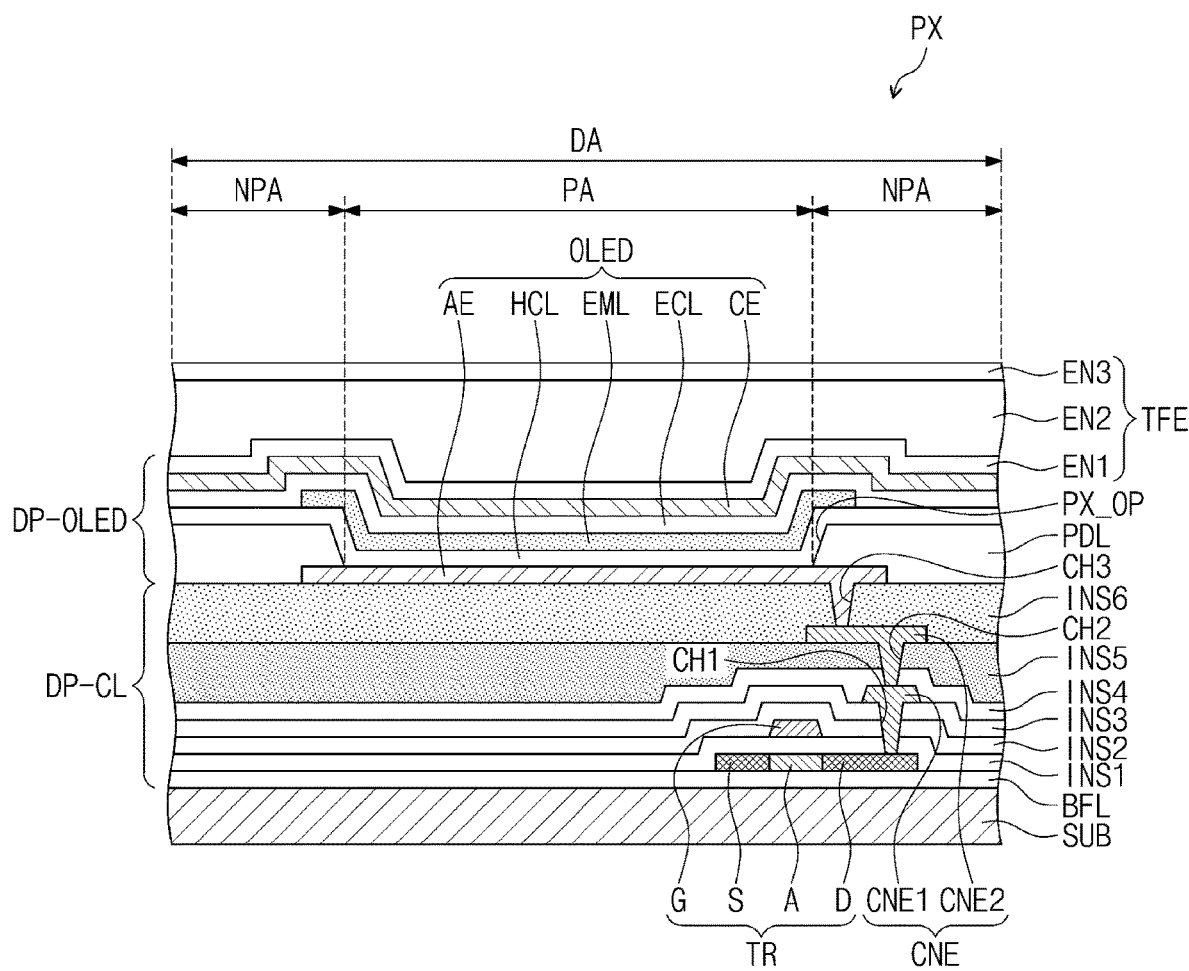
FIG. 5 illustrates a cross section of a pixel shown in FIG. 4.

FIG. 5 illustrates a cross section of any one pixel shown in FIG. 4.

Referring to FIG. 5, the pixel PX may include a transistor TR and a light emitting element OLED. The light emitting element OLED may include a first electrode AE, a second electrode CE, a hole control layer HCL, an electron control layer ECL, and a light emitting layer EML. The first electrode AE may be an anode, and the second electrode CE may be a cathode.

The transistor TR and the light emitting element OLED may be disposed on the substrate SUB. For example, one transistor TR is illustrated, but the pixel PX may include a plurality of transistors for driving the light emitting element OLED, and at least one capacitor.

The display area DA may include a light emitting area PA and non-light emitting areas NPA around the light emitting area PA, which correspond to each of the pixels PX. The light emitting element OLED may be disposed in the light emitting area PA.

A buffer layer BFL may be disposed on the substrate SUB, and the buffer layer BFL may be an inorganic layer. A semiconductor pattern may be disposed on the buffer layer BFL. The semiconductor pattern may include polysilicon. However, an embodiment of the inventive concept is not limited thereto, and the semiconductor pattern may include amorphous silicon or a metal oxide.

The semiconductor pattern may be doped with an N-type dopant or a P-type dopant. The semiconductor pattern may include a high-doped area and a low-doped area. The conductivity of the high-doped area may be greater than that of the low-doped area, and the high-doped area may correspond to the source and drain electrodes of the transistor TR. The low-doped area may correspond to an active area (or a channel) of the transistor.

A source S, an active area A, and a drain D of the transistor TR may be configured from the semiconductor pattern. A first insulation layer INS1 may be disposed on the semiconductor pattern. A gate G of the transistor TR may be disposed on the first insulation layer INS1. A second insulation layer INS2 may be disposed on the gate G. A third insulation layer INS3 may be disposed on the second insulation layer INS2.

A connection electrode CNE may be disposed between the transistor TR and the light emitting element OLED to connect the transistor TR and the light emitting element OLED to each other. The connection electrode may include a first connection electrode CNE1 and a second connection electrode CNE2.

The first connection electrode CNE1 may be disposed on the third insulation layer INS3, and be connected to the drain D through a first contact hole CH1 in the first to third insulation layers INS1 to INS3. A fourth insulation layer INS4 may be disposed on the first connection electrode CNE1. A fifth insulation layer INS5 may be disposed on the fourth insulation layer INS4.

The second connection electrode CNE2 may be disposed on the fifth insulation layer INS5. The second connection electrode CNE2 may be connected to the first connection electrode CNE1 through a second contact hole CH2 in the fourth and fifth insulation layers INS4 and INS5.

A sixth insulation layer INS6 may be disposed on the second connection electrode CNE2. The layers from the buffer layer BFL to the sixth insulation layers INS6 may be referred to as the circuit element layer DP-CL. The first insulation layer INS1 to the sixth insulation layer INS6 may be inorganic layers or organic layers.

The first electrode AE may be disposed on the sixth insulation layer INS6. The first electrode AE may be connected to the second connection electrode CNE2 through a third contact hole CH3 in the sixth insulation layer INS6. A pixel definition layer PDL for exposing a prescribed portion of the first electrode AE may be disposed on the first electrode AE and the sixth insulation layer INS6. In the pixel definition layer PDL, an opening part PX_OP may expose the prescribed portion of the first electrode AE.

The hole control layer HCL may be disposed on the first electrode AE and the pixel definition layer PDL. The hole control layer HCL may be commonly disposed in the light emitting area PA and the non-light emitting area NPA. The hole control layer HCL may include a hole transport layer and a hole injection layer.

The light emitting layer EML may be disposed on the hole control layer HCL. The light emitting layer EML may be disposed in an area corresponding to the opening part PX_OP. The light emitting layer EML may include an organic material and/or inorganic material. The light emitting layer EML may generate light of one of red, green, or blue colors.

The electron control layer ECL may be disposed on the light emitting layer EML and the hole control layer HCL. The electron control layer ECL may be commonly disposed in the light emitting area PA and the non-light emitting area NPA. The electron control layer ECL may include an electron transport layer and an electron injection layer.

The second electrode CE may be disposed on the electron control layer ECL. The second electrode CE may be commonly disposed to the pixels PX. The layer in which the light emitting element OLED is disposed may be referred to as the display element layer DP-OLED.

The thin film encapsulation layer TFE may be disposed on the second electrode CE to cover the pixels PX. The thin film encapsulation layer TEE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may be inorganic layers, and the second encapsulation layer EN2 may be an organic layer. The first and third encapsulation layers EN1 and EN3 may protect the pixels PX from moisture/oxygen. The second encapsulation layer EN2 may protect the pixels PX from a foreign matter such as a dust particle.

The first voltage may be applied to the first electrode AE, and the second voltage may be applied to the second electrode CE through the transistor TR. A hole and an electron injected to the light emitting layer EML may be combined to provide an exciton, and the light emitting element OLED may emit light while the exciton is transitioned to the ground state.

Figure 6:
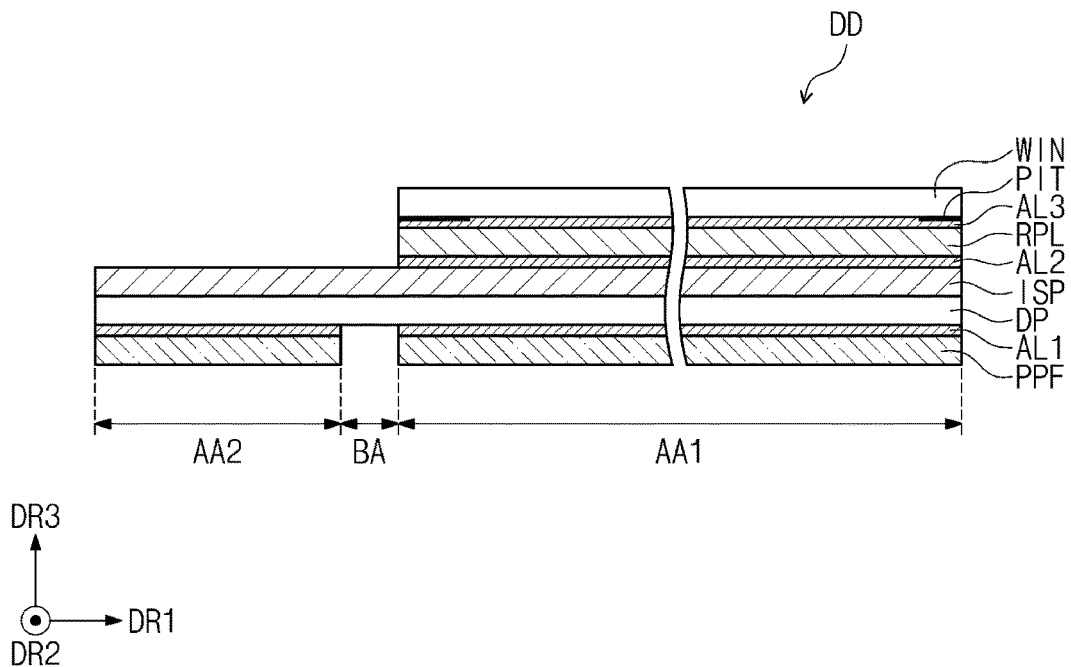
FIG. 6 is a cross-sectional view in a second direction of the display device illustrated in FIG. 1.
Figure 7:
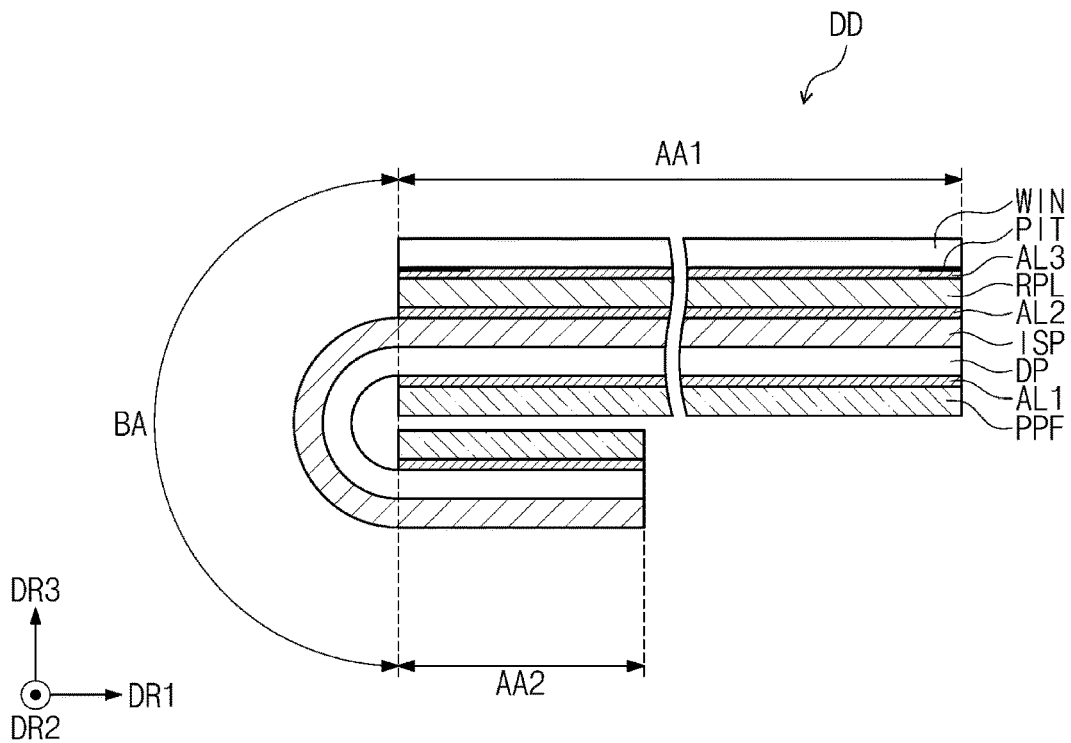
FIG. 7 illustrates a bending state of the display device illustrated in FIG. 6.

FIG. 6 is a cross-sectional view in a second direction of the display device illustrated in FIG. 1. FIG. 7 illustrates a bending state of the display device illustrated in FIG. 6.

Referring to FIGS. 6 and 7, similarly to the display panel DP, the display device DD may include the first area AA1, the second area AA2, and the bending area BA. For example, the bending area BA may be disposed between the first and second areas AA1 and AA2. The panel protection film PPF may be disposed in the first and second areas AA1 and AA2, and may not be disposed in the bending area BA. In other words, an opening may be provided in the panel protection film PPF in the bending area BA. An opening may also be provided in the first adhesive layer AL1 in the bending area BA. The reflection prevention layer RPL and the window WIN may be disposed in the first area AA1

The bending area BA may be bent to cause the second area AA2 to be disposed below the first area AA1. The second area AA2 may be disposed below the first area AA1 so as not to be visually recognized externally. The panel protection film PPF is not disposed in the bending area BA, and thus the thickness of the bending area BA may be relatively thin. Accordingly, the bending area BA may be easily bent.

Figure 8:
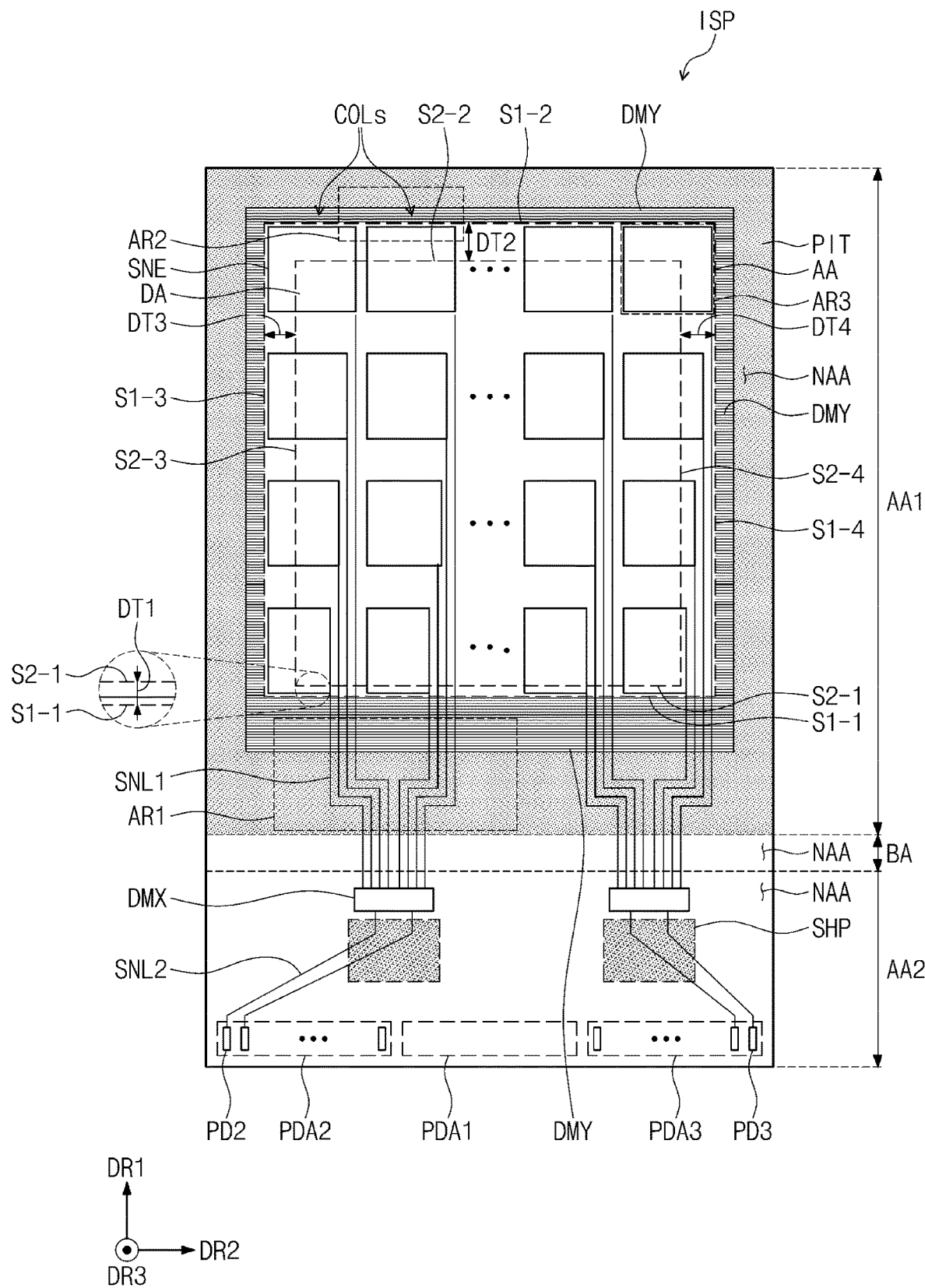
FIG. 8 is a plan view of an input sensing part illustrated in FIG. 2.
Figure 9:
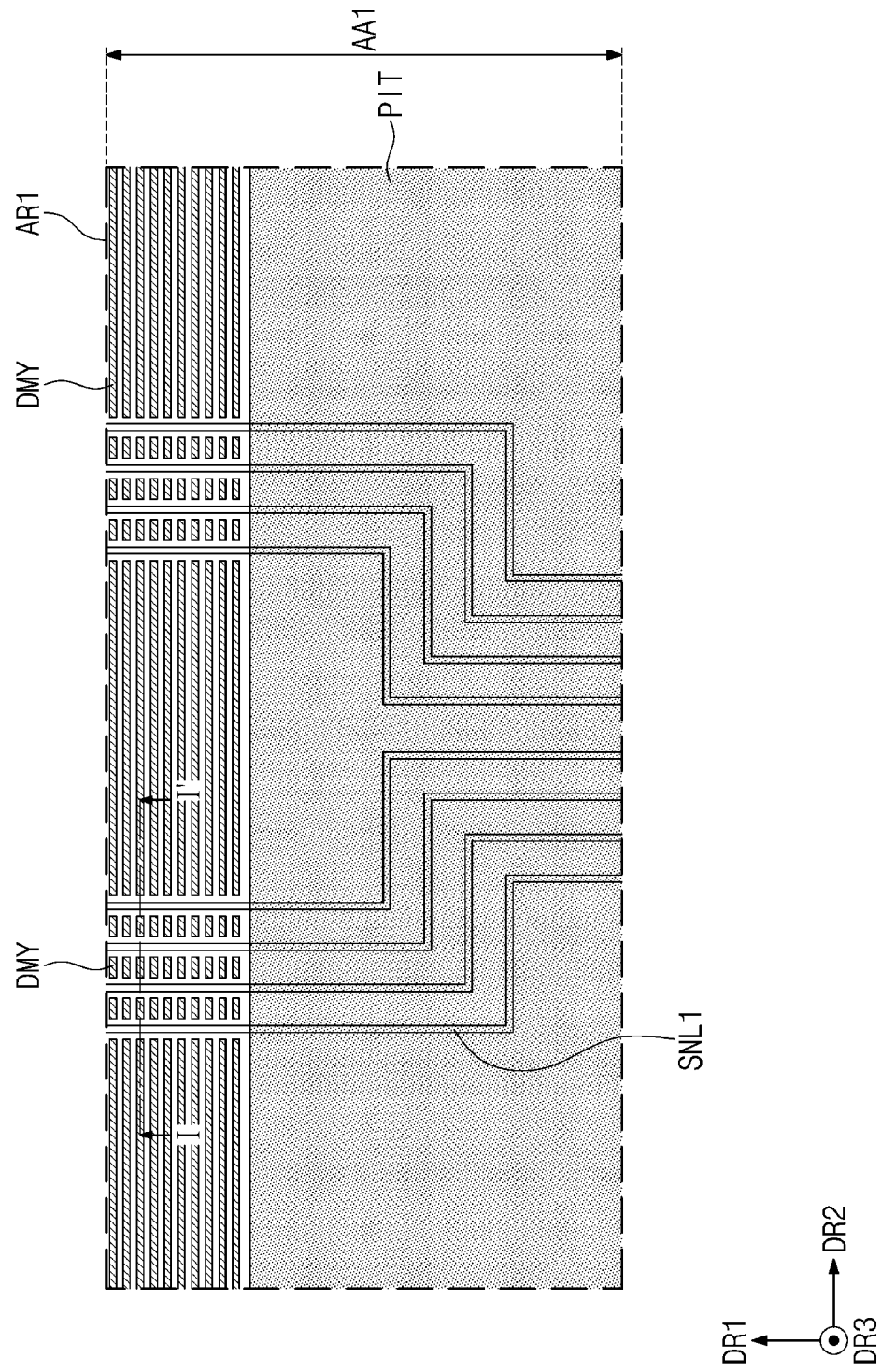
FIG. 9 is an enlarged view of a first area AR1 illustrated in FIG. 8.
Figure 10:
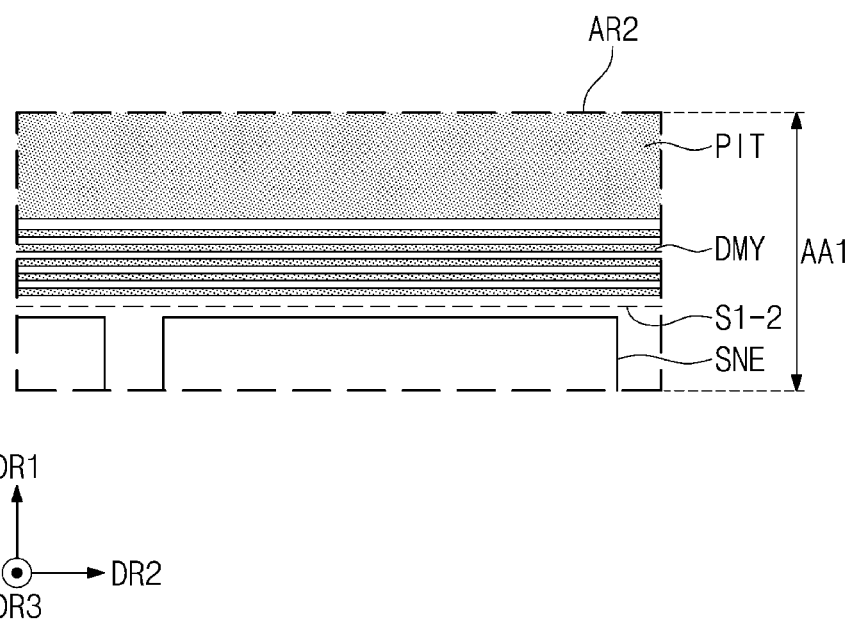
FIG. 10 is an enlarged view of a second area AR2 illustrated in FIG. 8.

FIG. 8 is a plan view of an input sensing part illustrated in FIG. 2. FIG. 9 is an enlarged view of a first area AR1 illustrated in FIG. 8. FIG. 10 is an enlarged view of a second area AR2 illustrated in FIG. 8.

The first area AR1 and the second area AR2 may be portions of the first area AA1. For example, FIG. 8 illustrates the print layer PIT shown in FIG. 2 together with the input sensing part ISP.

Referring to FIG. 8, the input sensing part ISP may include a plurality of sensing electrodes SNE, a plurality of sensing lines SNL1 and SNL2, a plurality of dummy patterns DMY, a plurality of demultiplexer (or DEMUX) circuits DMX, pluralities of second and third pads PD2 and PD3, and a plurality of shield patterns SHP.

Similarly to the display panel DP, a planar area of the input sensing part ISP may include the first area AA1, the second area AA2, and the bending area BA. The first area AA1 may include an active area AA and a non-active area NAA around the active area AA. The non-active area NAA may surround the active area AA.

The active area AA overlaps the display area DA, and the non-active area NAA may overlap the non-display area NDA. The second area AA2 and the bending area BA may be referred to as the non-active area NAA.

The sensing electrodes SNE may be disposed in the active area AA, and the second and third pads PD2 and PD3 may be disposed in the second area AA2. The sensing lines SNL1 and SNL2 may be connected to the sensing electrodes SNE and extend to the second area AA2 via the bending area BA. The sensing lines SNL1 and SNL2 may be connected to the second and third pads PD2 and PD3. For example, the sensing lines SNL1 and SNL2 may be connected to the second and third pads PD2 and PD3 via the DEMUX circuits DMX.

The second and third pads PD2 and PD3 may be respectively connected to second and third connection pads PCB-PD2 and PCB-PD3 shown in FIG. 4. The input sensing controller IS-IC may control the operation of the input sensing part ISP.

The sensing electrodes SNE may have unique coordinate information. The sensing electrodes SNE may be arranged in a matrix shape to be connected to the sensing lines SNL1 and SNL2. However, the arrangement of the sensing electrodes SNE is not particularly limited.

The sensing electrodes SNE may be arranged in a plurality of columns. The columns may correspond to a first direction DR1. The sizes of the sensing electrodes SNE disposed in an h-th column may decrease from top to bottom, but the sizes of the sensing electrodes SNE are not limited thereto.

The input sensing part ISP according to an embodiment of the inventive concept may be driven in a self sensing mode to acquire coordinate information in a self capacitance manner. For example, the input sensing controller IS-IC may operate each of the sensing electrodes SNE as a driving electrode or a sensing electrode. The input sensing controller IS-IC may apply a driving signal to each of the sensing electrodes SNE through the sensing lines SNL1 and SNL2, and receive a sensing signal from each of the sensing electrodes SNE.

The sensing lines SNL1 and SNL2 may include a plurality of first sensing lines SNL1 and a plurality of second sensing lines SNL2. The first sensing lines SNL1 may be respectively connected to the sensing electrodes SNE to extend in the first direction DR1.

The first sensing lines SNL1 may be connected to one side of each of the sensing electrodes SNE. For example, the first sensing lines SNL1 may be respectively connected to the right side of each of the sensing electrodes SNE on a plane in FIG. 8 to extend in the first direction DR1. However, the inventive concept is not limited thereto and the first sensing lines SNL1 may be connected to the left sides of each of the sensing electrodes SNE. In addition, the first sensing lines SNL1 may be alternately connected to the left and right sides of the sensing electrodes SNE in a column.

The first sensing lines SNL1 connected to the sensing electrodes SNE disposed in the h-th column are disposed between the sensing electrodes SNE in the h-th column and sensing electrodes SNE in an (h+1)-th column to extend in the first direction DR1. Here, h is a natural number.

The first sensing lines SNL1 may extend to the non-active area NAA. The first sensing lines SNL1 may extend to the second area AA2 via the bending area BA.

The second sensing lines SNL2 may be disposed in the second area AA2. The number of the second sensing lines SNL2 may be smaller than that of the first sensing lines SNL1.

The DEMUX circuits DMX may be disposed in the second area AA2. The DEMUX circuits DMX may be adjacent to the bending area BA. The bending area BA may be located between the DEMUX circuits DMX and a 1-1 side S1-1 to extend in a second direction DR2. The 1-1 side may correspond to a lower side of the active area AA.

The DEMUX circuits DMX may be disposed between the first sensing lines SNL1 and the second sensing lines SNL2. The first sensing lines SNL1 and the second sensing lines SNL2 may be connected to the DEMUX circuits DMX.

Each of the DEMUX circuits DMX may be connected to the sensing electrodes SNE arranged in at least two columns COLs. For example, each of the DEMUX circuits DMX may be connected to the first sensing lines SNL1 connected to the sensing electrodes SNE arranged in at least two columns COLs. Each of the DEMUX circuits DMX may be connected to at least two second sensing lines SNL2.

For example, the sensing electrodes SNE arranged in two columns COLs and the two second sensing lines SNL2 are connected to each of the DEMUX circuits DMX, but the numbers of the sensing electrodes SNE and the second sensing lines SNL2 to be connected to each of the DEMUX circuits DMX may be greater than that.

The number of the second sensing lines SNL2 connected to each of the DEMUX circuits DMX may be smaller than that of the first sensing lines SNL1 connected to the DEMUX circuits DMX. Each of the DEMUX circuits DMX may connect, two second sensing lines SNL2 to, at least two first sensing lines SNL1 among the first sensing lines SNL1 connected to the sensing electrodes arranged in at least two columns COLs. Such a structure of the DEMUX circuits DMX will be described below with reference to FIG. 17.

The second sensing lines SNL2 may be connected to the second and third pads PD2 and PD3. Similarly to the display panel DP, a first pad area PDA1, a second pad area PDA2, and a third pad area PDA3 may be provided in a portion of the second area AA2, the portion being adjacent to the lower end of the second area AA2 of the input sensing part ISP. The second pads PD2 may be disposed in the second pad area PDA2, and the third pads PD3 may be disposed in the third pad area PDA3.

Dotted lines indicating the active area AA in FIG. 8 are it to be separated from the edges of the outermost sensing electrodes SNE without being overlapped therewith to more clearly illustrate the active area AA. However, the edge of the active area AA may overlap the edges of the outermost sensing electrodes SNE.

The active AA may have a greater area than the display area DA. The edges of the active area AA may be disposed at the outer edges of the display area DA. The active area AA may be separated from the display area DA by different distances. Accordingly, an upper side of the active area AA may be further separated from the edge of the display area DA than a lower side of the active area AA.

For example, both sides of the active area AA, which are opposite in the first direction DR1, may be referred to as a 1-1 side S1-1 and a 1-2 side S1-2. Both sides of the active area AA, which are opposite in the second direction DR2, may be referred to as a 1-3 side S1-3 and a 1-4 side S1-4. The display area DA may be surrounded by the 1-1 side S1-1, the 1-2 side S1-2, the 1-3 side S1-3 and the 1-4 side S1-4. The 1-1 side S1-1, the 1-2 side S1-2, the 1-3 side S1-3 and the 1-4 side S1-4 may be referred to as first, second, third and fourth sides of the active area AA, or fifth, sixth, seventh and eighth sides of the active area AA.

Both sides of the display area DA, which are opposite in the first direction DR1, may be referred to as a 2-1 side S2-1 and a 2-2 side S2-2. Both sides of the display area DA, which are opposite in the second direction DR2, may be referred to as a 2-3 side S2-3 and a 2-4 side S2-4. The 2-1 side S2-1, the 2-2 side S2-2, the 2-3 side S2-3 and the 2-4 side S2-4 may be referred to as first, second, third and fourth sides of the display area DA, or fifth, sixth, seventh and eighth sides of the display area DA The 1-1 side S1-1 and the 2-1 side S2-1 may be adjacent to the bending area BA. The 1-1 side S1-1 may be closer to the bending area BA than the 2-1 side S2-1. The 1-1 side S1-1 may be adjacent to the 2-1 side S2-1, and the 1-2 side S1-2 may be adjacent to the 2-2 side S2-2. The 1-3 side S1-3 may be adjacent to the 2-3 side S2-3, and the 1-4 side S1-4 may be adjacent to the 2-4 side S2-4.

The distance between the 1-1 side S1-1 and the 2-1 side S2-1 may be a first distance DT1, and the distance between the 1-2 side S1-2 and the 2-2 side S2-2 may be a second distance DT2. The distance between the 1-3 side S1-3 and the 2-3 side S2-3 may be a third distance DT3, and the distance between the 1-4 side S1-4 and the 2-4 side S2-4 may be a fourth distance DT4.

The first distance DT1 may be smaller than the second distance DT2. In addition, the first distance DT1 may be smaller than the third distance DT3 and the fourth distance DT4. The second distance DT2 may be larger than the third distance DT3 and the fourth distance DT4. The third distance DT3 may be the same as the fourth distance DT4, but is not limited thereto. The third distance DT3 may also be different from the fourth distance DT4.

According to the aforementioned structures of the active area AA and the display area DA, the edges of the sensing electrodes SNE, which are adjacent to the 1-2 side S1-2, may be disposed farther from a nearest side of the display area DA than the edges of the sensing electrodes SNE, which are adjacent to the 1-1 side S1-1. In other words, a larger portion of the sensing electrodes SNE which are adjacent to the 1-2 side S1-2 may be exposed compared to the sensing electrodes SNE which are adjacent to the 1-1 side S1-1.

The edges of the sensing electrodes SNE, which are adjacent to the 1-3 side S1-3, and the edges of the sensing electrodes SNE, which are adjacent to the 1-4 side S1-4 may be disposed farther from respective nearest sides of the display area DA than the edges of the sensing electrodes SNE, which are adjacent to the 1-1 side S1-1.

The edges of the sensing electrodes SNE, which are adjacent to the 1-2 side S1-2, may be disposed farther from a nearest side of the display area DA than the edges of the sensing electrodes SNE, which are adjacent to the 1-3 side S1-3 and the edges of the sensing electrodes SNE, which are adjacent to the 1-4 side S1-4.

The active area AA is shifted and disposed upwards relative to the display area DA, and thus, the non-active area NAA below the active area AA may be further secured. In other words, the non-active area NAA around the 1-1 side S1-1 of the active area AA may be further extended. In other words, the non-active area NAA around to the 1-1 side S1-1 of the active area AA may increase in size. The non-active area NAA around the 1-1 side S1-1 may include the non-active area NAA adjacent to the 1-1 side S1-1, the bending area BA, and the second area AA2.

The first and second sensing lines SNL1 and SNL2 may be disposed in the non-active area NAA around the 1-1 side S1-1. Since the non-active area NAA around the 1-1 side S1-1 extends, an area in which the first and second sensing lines SNL1 and SNL2 are to be disposed may be further secured.

The print layer PIT may be separated from the active area AA to overlap the non-active area NAA. The print layer PIT may surround the active area AA. The print layer PIT may be disposed away from the boundary of the display area DA. However, when the print layer PIT is disposed into the display area DA due to a process error, an image may be blocked by the print layer PIT.

Accordingly, to prevent such a defect, the print layer PIT may be disposed farther away from an outer side of the display area DA in consideration of an align margin. In this case, the print layer PIT may be separated from the active area AA and be disposed away an outer side of the active area AA.

Referring to FIGS. 8, 9 and 10, the dummy patterns DMY may be disposed between the boundary of the active area AA and the print layer PIT. The dummy patterns DMY may be implemented with slit patterns. For example, the dummy patterns DMY may extend from the non-active area NAA in the second direction DR2 and may be arranged in the first direction DR1. The dummy patterns DMY may be disposed between the first sensing lines SNL1 in the non-active area NAA adjacent to the 1-1 side S1-1.

The circuit patterns (for example, the elements of the scan driver SDV and the light emission driver EDV) of the display panel DP may not be visually recognized from the outside due to the print layer PIT. Configurations are required for blocking circuit patterns of the display panel DP in an area between the display area DA and the print layer PIT.

The sensing electrodes SNE disposed outside the display area DA may block the circuit patterns so that the circuit patterns are not visually recognized from the outside. The sensing electrodes SNE may not be disposed between the print layer PIT and the boundary of the active area AA. Between the print layer PIT and the boundary of the active area AA, the dummy patterns DMY may block the circuit patterns so that the circuit patterns are not visually recognized from the outside.

When the dummy patterns DMY are not provided in a slit shape but in a box electrode shape, a parasite capacitance produced by the box electrode and the circuit patterns of the display panel DP may increase. Accordingly, the dummy patterns DMY may be provided in the slit shape.

Shield patterns SHP may respectively abut on the DEMUX circuits DMX. When viewed on a plane, the shield patterns SHP may overlap the second sensing lines SNL2 adjacent to the DEMUX circuits DMX. The function of the shield patterns SHP will be described in detail below.

An embodiment of the inventive concept provides a display device DD including: a display panel DP that includes a display area DA and a plurality of pixels PX disposed in the display area DA; and an input sensing part ISP disposed on the display panel DP, wherein the input sensing part ISP includes an active area AA and a plurality of sensing electrodes SNE disposed in the active area AA, wherein a first distance DT1 between a 1-1 side (S1-1) of the active area and a 2-1 side (S2-1) of the display area is smaller than a second distance DT2 between a 1-2 side (S1-2) of the active area and a 2-2 side (S2-2) of the display area, wherein the 1-1 side (S1-1) and the 2-1 side (S2-1 are adjacent to each other and the 1-2 side (S1-2) and the 2-2 side (S2-2) are adjacent to each other, and the 1-1 side (S1-1) and the 1-2 side (S1-2) are opposite to each other in a first direction DR1, and the 2-1 side (S2-1) and the 2-2 side (S2-2) are opposite to each other in the first direction DR1.

Figure 11:
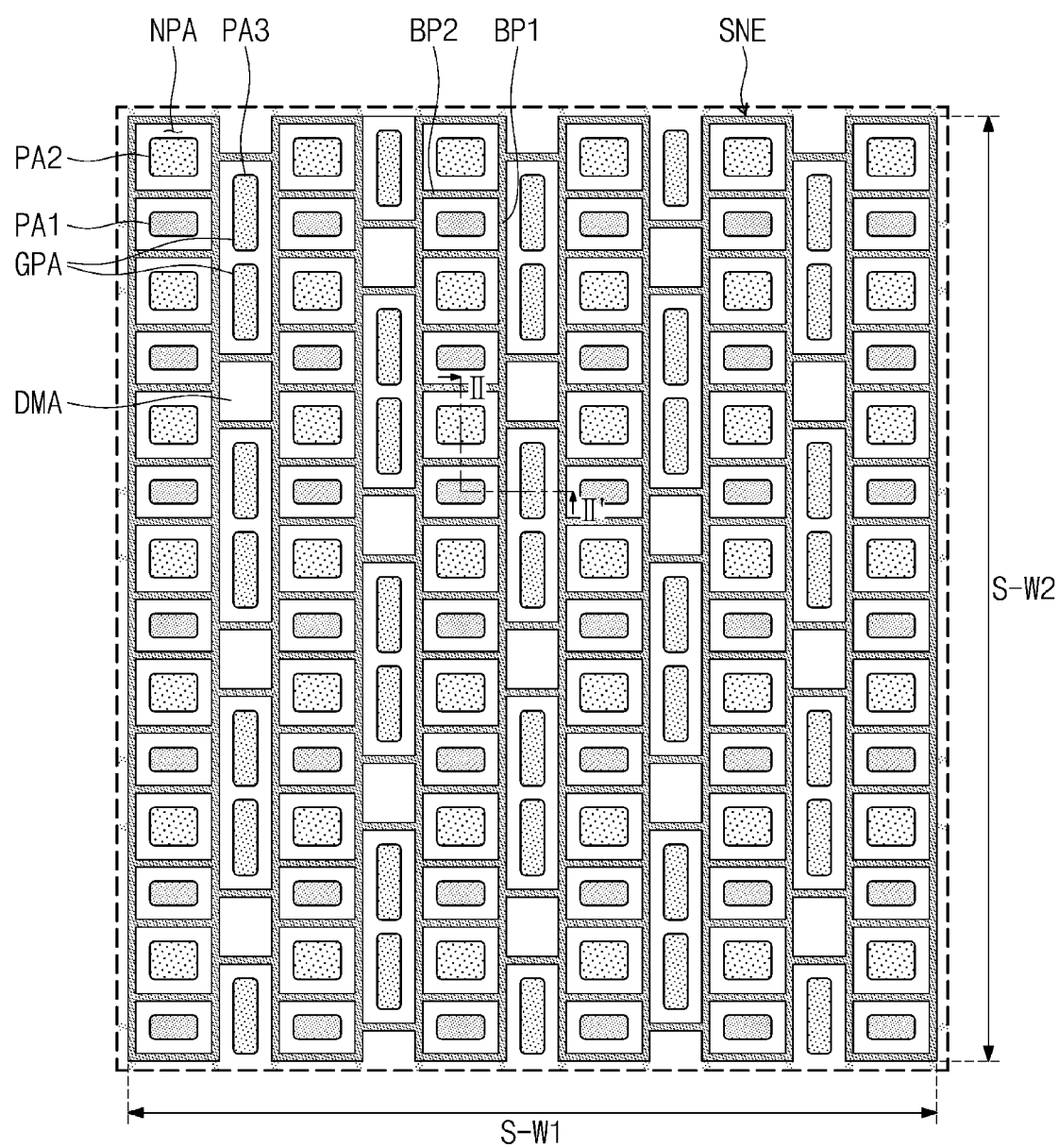
FIG. 11 illustrates a plan configuration of a sensing electrode disposed in a display area illustrated in FIG. 8.
Figure 12:
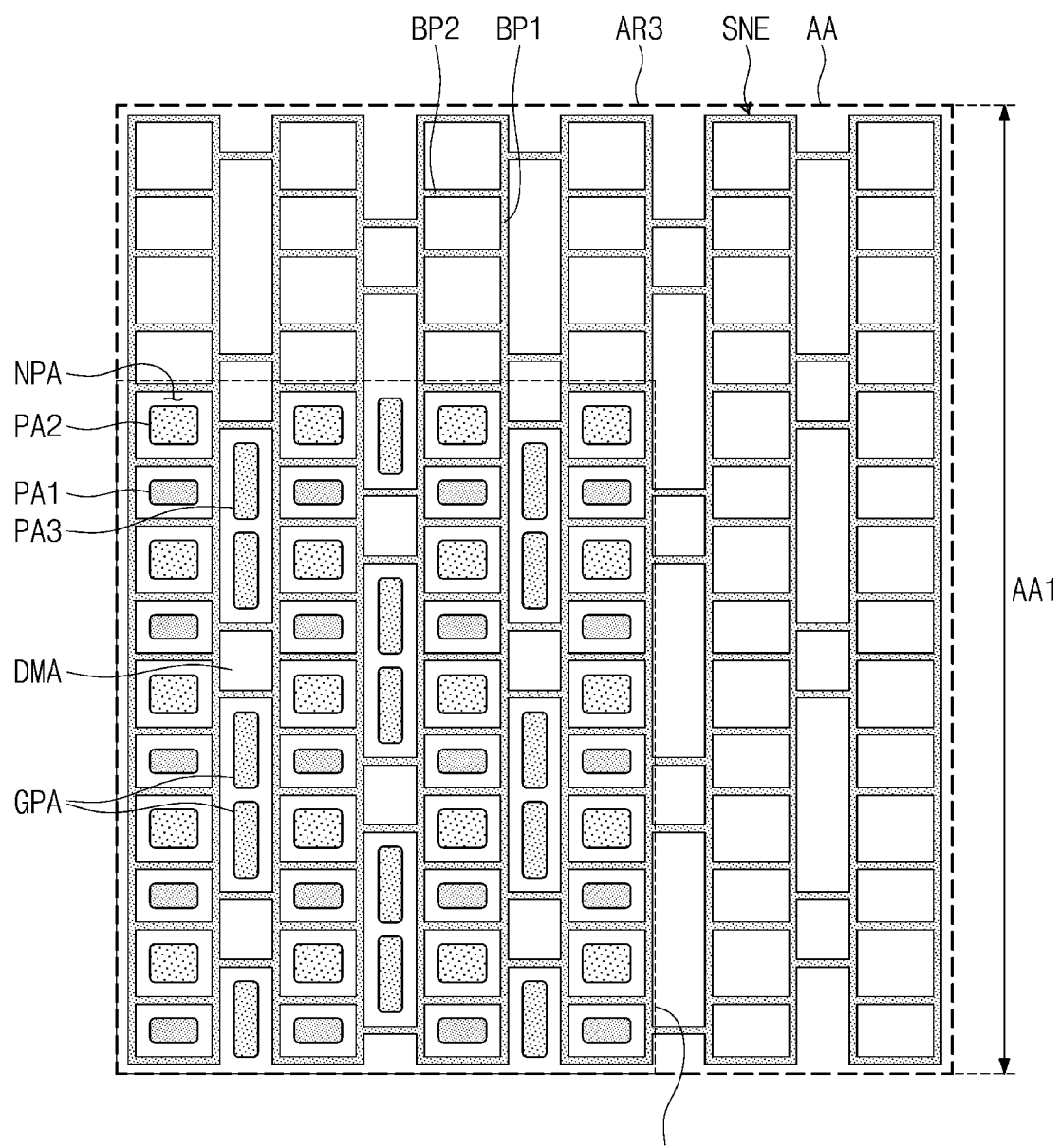
FIG. 12 illustrates a plan configuration of a sensing electrode disposed in a third area AR3 illustrated in FIG. 8.

FIG. 11 illustrates a plan configuration of a sensing electrode disposed in the display area illustrated in FIG. 8. FIG. 12 illustrates a plan configuration of a sensing electrode disposed in the third area AR3 illustrated in FIG. 8.

The third area AR3 may be a portion of the first area AA1. For example, in FIGS. 11 and 12, the light emitting areas PA1, PA2, and PA3 and the non-light emitting area NPA are illustrated together with the sensing electrode SNE.

Referring to FIG. 11, the sensing electrodes SNE may have a mesh shape. For example, the sensing electrode SNE may include a plurality of first branch units BP1 extending in the first direction DR1 and a plurality of second branch units BP2 extending in the second direction DR2.

The first branch units BP1 may be integrated with the second branch units BP2. The first and second branch units BP1 and BP2 may be referred to as mesh lines, and the line width of each of the mesh lines may be several micrometers. The first and second branch units BP1 and BP2 may include metal.

The light emitting areas PA1, PA2, and PA3 may include a plurality of first light emitting areas PA1 for displaying a red color, a plurality of second light emitting areas PA2 for displaying a green color, and a plurality of third light emitting areas PA3 for displaying a blue color. The first, second and third light emitting areas PA1, PA2 and PA3 may have a rectangular shape. The light emitting area PA illustrated in FIG. 5 may be any one of the first, second, or third light emitting area PA1, PA2, or PA3.

The first and second light emitting areas PA1 and PA2 may be alternately arranged in the first direction DR1. The third light emitting areas PA3 may be arranged in the first direction DR1. Every two of the third light emitting areas PA3 may be grouped to be arranged in the first direction DR1. The third light emitting areas PA3 grouped by two areas may be referred to as group light emitting areas GPA.

The dummy areas DMA may be disposed between the group light emitting areas GPA. The first, second and third light emitting areas PA1, PA2, and PA3 may not be disposed in the dummy areas DMA.

The third light emitting areas PA3 arranged in a k-th column may be disposed between the first and second light emitting areas PA1 and PA2 arranged in the (k−1)-th column, and the first and second light emitting areas PA1 and PA2 arranged in a (k+1)-th column.

The first and second branch units BP1 and BP2 may be disposed between the first and second light emitting areas PA1 and PA2, between the group light emitting areas GPA and the first and second light emitting areas PA1 and PA2, between the dummy areas DMA and the first and second light emitting areas PA1 and PA2, and between the group light emitting areas GPA and the dummy areas DMA.

The first and second branch units BP1 and BP2 may be disposed in the non-light emitting area NPA. Accordingly, light generated from the first, second, and third light emitting areas PA1, PA2, and PA3 may be normally output without being influenced by the first and second branch units BP1 and BP2.

Referring to FIGS. 8 and 11, widths S-W1 and S-W2 of the sensing electrodes SNE may be set to include a prescribed number of the first, second and third light emitting areas PA1, PA2 and PA3 in the first and second directions DR1 and DR2. However, in this case, as shown FIG. 8, the sensing electrodes SNE may not be accurately disposed in the display area DA. Accordingly, as shown in FIG. 8, some of the sensing electrodes SNE disposed in the outermost side may be disposed outside the display area DA. The structure of such sensing electrodes SNE is illustrated in FIG. 12.

Referring to FIG. 12, a portion of the sensing electrodes SNE disposed in an outer side of the display area DA in which the first, second, and third light emitting areas PA1, PA2, and PA3 are not provided may have a mesh shape. In other words, the portion of the sensing electrodes SNE disposed in the outer side of the display area DA may also include a plurality of first branch units BP1 and a plurality of second branch units BP2 with the mesh shape.

When the portion of the sensing electrodes SNE disposed in the outer side of the display area DA is provided with a box electrode, a parasite capacitance provided by the box electrode and the circuit patterns of the display panel DP may increase. Accordingly, the portion of the sensing electrodes SNE disposed in the outer side of the display area DA may have the mesh shape.

Figure 13:
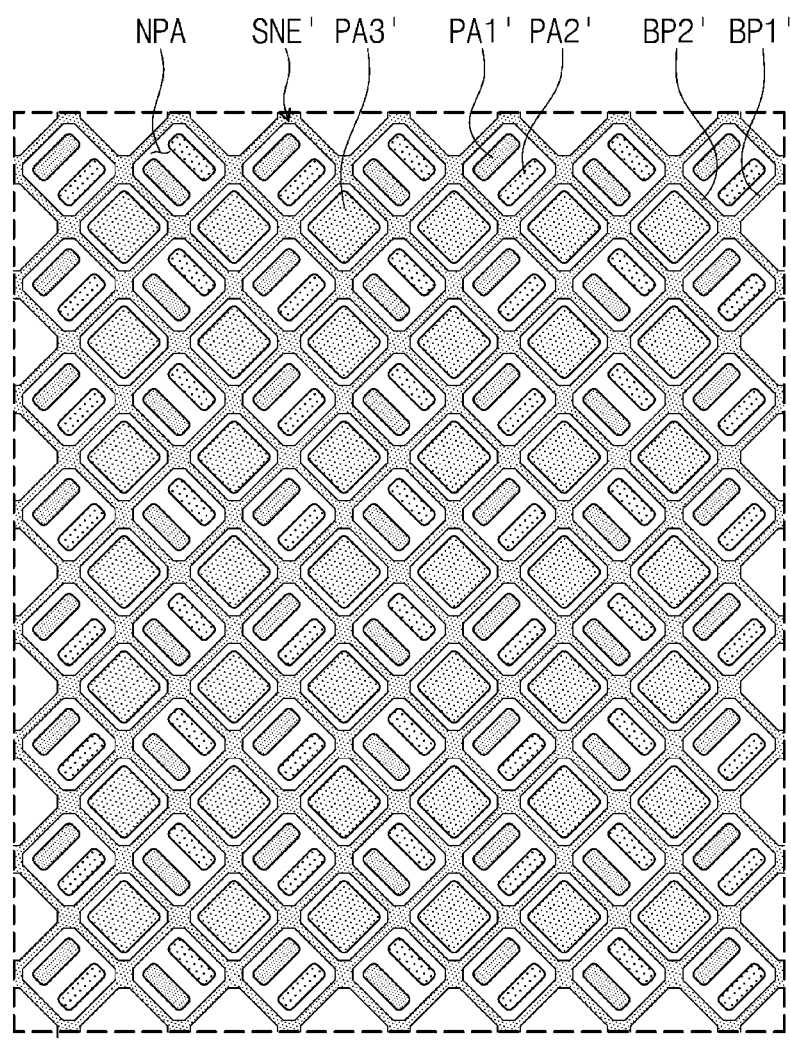
FIGS. 13 and 14 illustrate configurations of sensing electrodes according to other embodiments of the inventive concept.
Figure 13:
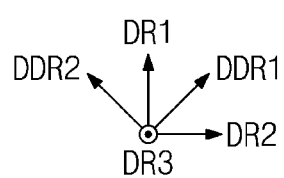
Figure 14:
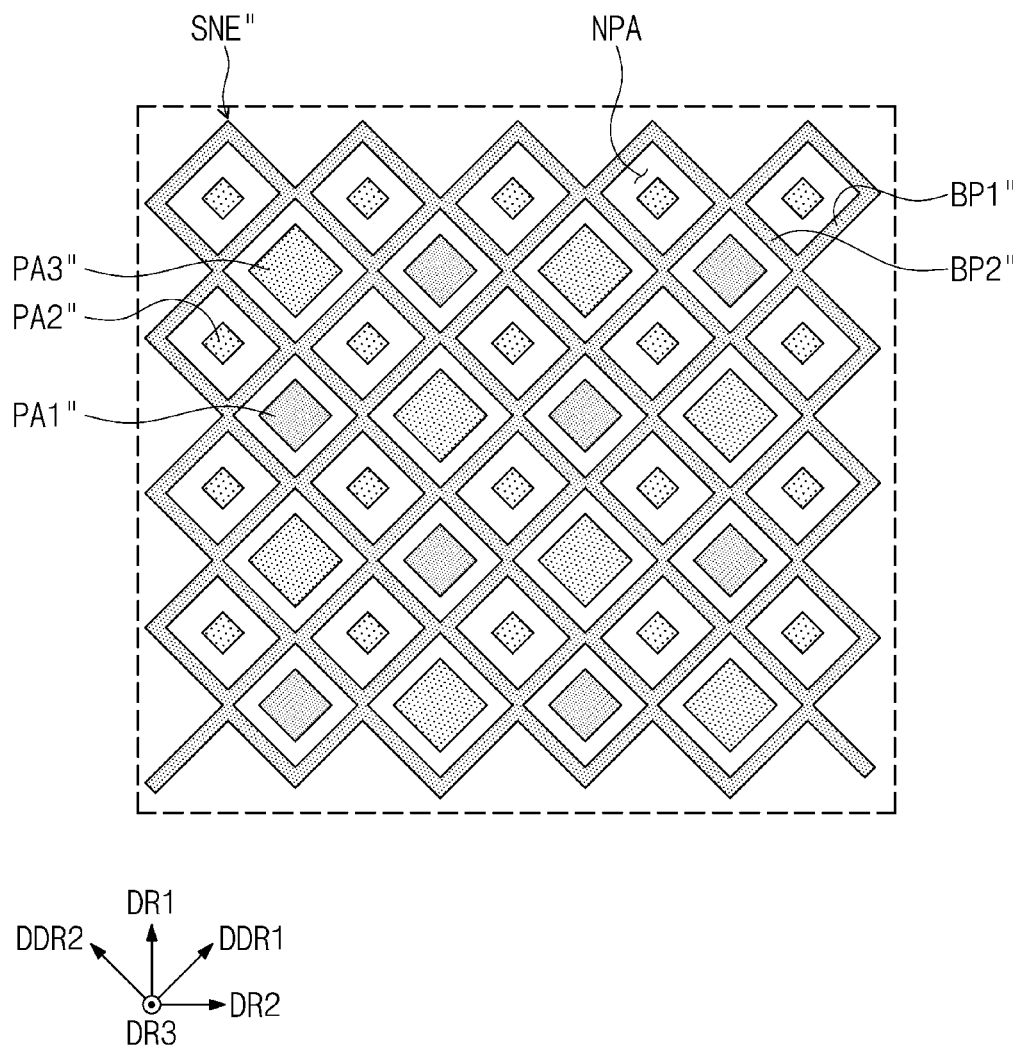

FIGS. 13 and 14 illustrate configurations of sensing electrodes according to another embodiment of the inventive concept.

Referring to FIG. 13, in order to have a mesh shape, sensing electrodes SNE' may include a plurality of first branch units BP1' extending in a first diagonal direction DDR1 and a plurality of second branch units BP2' extending in a second diagonal direction DDR2. The first branch units BP1' may intersect with and be integrated with the second branch units BP2'.

The first diagonal direction DDR1 may be a direction intersecting with the first and second directions DR1 and DR2 on a plane formed by the first and second directions DR1 and DR2. The second diagonal direction DDR2 may be a direction intersecting with the first diagonal direction DDR1 on the plane formed by the first and second directions DR1 and DR2. For example, the first direction DR1 may vertically intersect with the second direction DR2, and the first diagonal direction DDR1 may vertically intersect with the second diagonal direction DDR2.

Light emitting areas PA1', PA2', and PA3' may include a plurality of first light emitting areas PA1' for displaying a red color, a plurality of second light emitting areas PA2' for displaying a green color, and a plurality of third light emitting areas PA3' for displaying a blue color.

The first and second light emitting areas PA1' and PA2' may have a bar shape extending in the first diagonal direction DDR1 or the second diagonal direction DDR2. The third light emitting areas PA3' may have a diamond shape. Individual first and second light emitting areas PA1' and PA2' may occupy less space than an individual third light emitting area PA3'.

The first and second light emitting areas PA1' and PA2' extending in the first diagonal direction DDR1 may be arranged in the second diagonal direction DDR2. The first and second light emitting areas PA1' and PA3' extending in the second diagonal direction DDR2 may be arranged in the first diagonal direction DDR1.

The third light emitting areas PA3' may be arranged in the first diagonal direction DDR1 and the second diagonal direction DDR2. A pair of the first and second light emitting areas PA1' and PA2' extending in the first diagonal direction DDR1 and a pair of the first and second light emitting areas PA1' and PA2' extending in the second diagonal direction DDR2 may be alternately arranged in the first and second diagonal directions DDR1 and DDR2.

A pair of first and second light emitting areas PA1' and PA2' extend in the same direction to be disposed between two adjacent third light emitting areas PA3'.

The first and second branch units BP1' and BP2' may overlap the non-light emitting area NPA. The first and second branch units BP1' and BP2' may be disposed between a pair of the first and second light emitting areas PA1' and PA2' and the third light emitting areas PA3'.

Referring to FIG. 14, in order to have a mesh shape, sensing electrodes SNE" may include a plurality of first branch units BP1" extending in the first diagonal direction DDR1 and a plurality of second branch units BP2" extending in the second diagonal direction DDR2. The first branch units BP1" may intersect with and be integrated with the second branch units BP2".

The light emitting areas PA1", PA2", and PA3" may include a plurality of first light emitting areas PA1" for displaying a red color, a plurality of second light emitting areas PA2" for displaying a green color, and a plurality of third light emitting areas PA3" for displaying a blue color. The first, second and third light emitting areas PA1", PA2" and PA3" may have a diamond shape.

The first and second light emitting areas PA1" and PA2" may be alternately arranged in the first diagonal direction DDR1 and the second diagonal direction DDR2. The second and third light emitting areas PA2" and PA3" may be alternately arranged in the first diagonal direction DDR1 and the second diagonal direction DDR2. The first and third light emitting areas PA1" and PA2" may be alternately arranged in the first and second directions DR1 and DR2. The third light emitting area PA3" may be larger than the first light emitting area PA1", and the first light emitting area PA1" may be larger than the second light emitting area PA2".

The first and second branch units BP1" and BP2" may overlap the non-light emitting area NPA. The first and second branch units BP1" and BP2" may be disposed between the first, second, and third light emitting areas PA1", PA2" and PA3".

Figure 15:
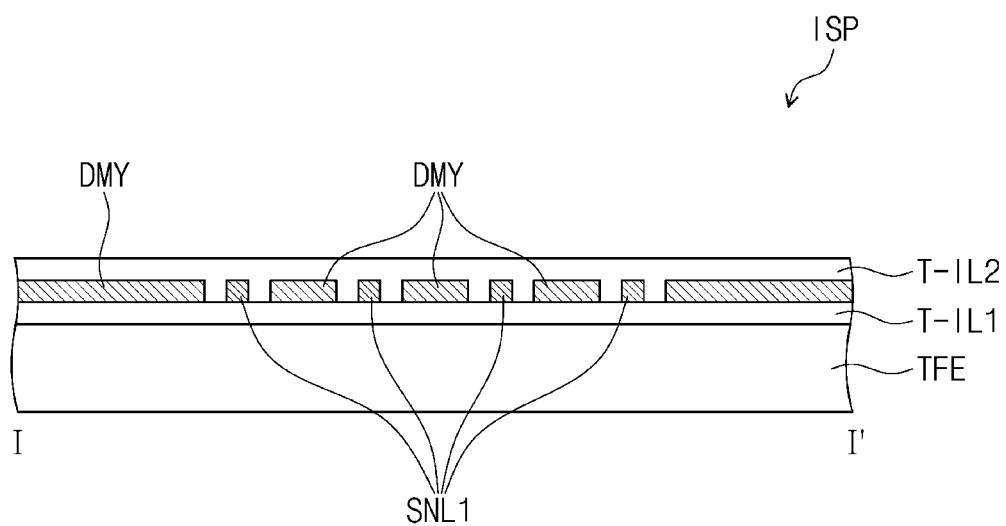
FIG. 15 is a cross-sectional view along line I-I' illustrated in FIG. 9.

FIG. 15 is a cross-sectional view along line I-I' illustrated in FIG. 9.

Referring to FIG. 15, the input sensing part ISP may include a first insulation layer T-IL1 disposed on the thin-film encapsulation layer TFE and a second insulation layer T-IL2 disposed on the first insulation layer T-IL1. The dummy patterns DMY and the first sensing lines SNL1 may be disposed on the first insulation layer T-IL1, and the second insulation layer T-IL2 may be disposed on the first insulation layer T-IL1 to cover the dummy patterns DMY and the first sensing lines SNL1. The dummy patterns DMY may be disposed between the first sensing lines SNL1. Spaces may be formed between the sensing lines SNL1 and adjacent dummy patterns DMY.

Figure 16:
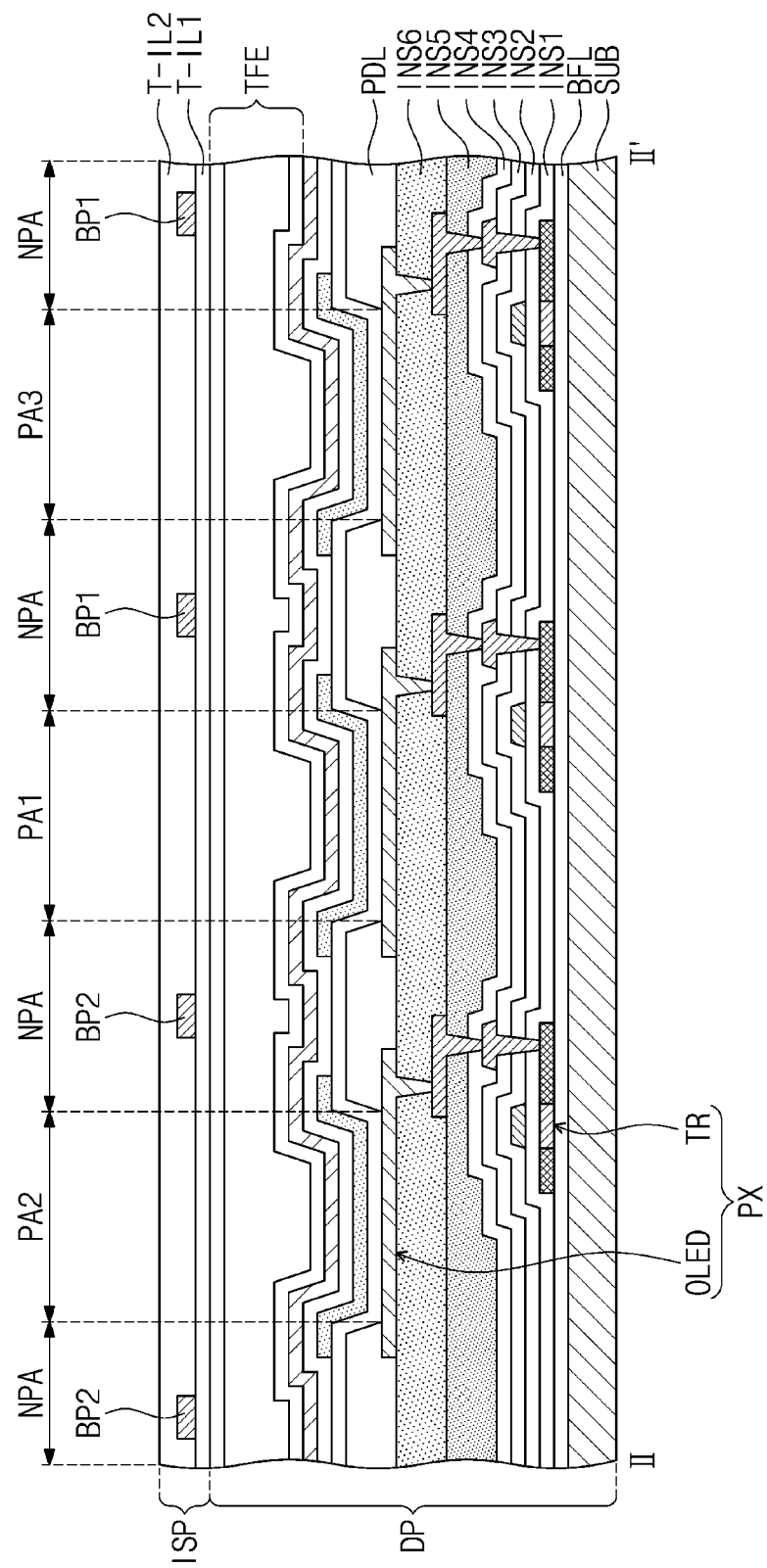
FIG. 16 is a cross-sectional view along line II-II' illustrated in FIG. 11.

FIG. 16 is a cross-sectional view along line II-II' shown in FIG. 11. For example, in FIG. 16, the pixels PX disposed under the thin-film encapsulation layer TFE are illustrated together with the sensing electrodes SNE. Hereinafter, a description will be provided with reference to FIG. 15 as necessary.

Referring to FIGS. 15 and 16, the sensing electrodes SNE may be disposed on the first insulation layer T-IL1, and the second insulation layer T-IL2 may be disposed on the first insulation layer T-IL1 to cover the sensing electrodes SNE.

As described above, the first and second branch units BP1 and BP2 may be disposed in the non-light emitting area NPA. The first and second branch units BP1 and BP2 are disposed on the first insulation layer T-IL1, and the second insulation layer T-IL2 may be disposed on the first insulation layer T-IL1 to cover the first and second branch units BP1 and BP2. In particular, the first and second branch units BP1 and BP2 are alternately disposed in the non-light emitting areas NPA.

The dummy patterns DMY and the first sensing lines SNL1 may be disposed on the same layer as the sensing electrodes SNE. The dummy patterns DMY and the first sensing lines SNL1 may be provided with the same material as the sensing electrodes SNE and substantially simultaneously patterned.

Figure 17:
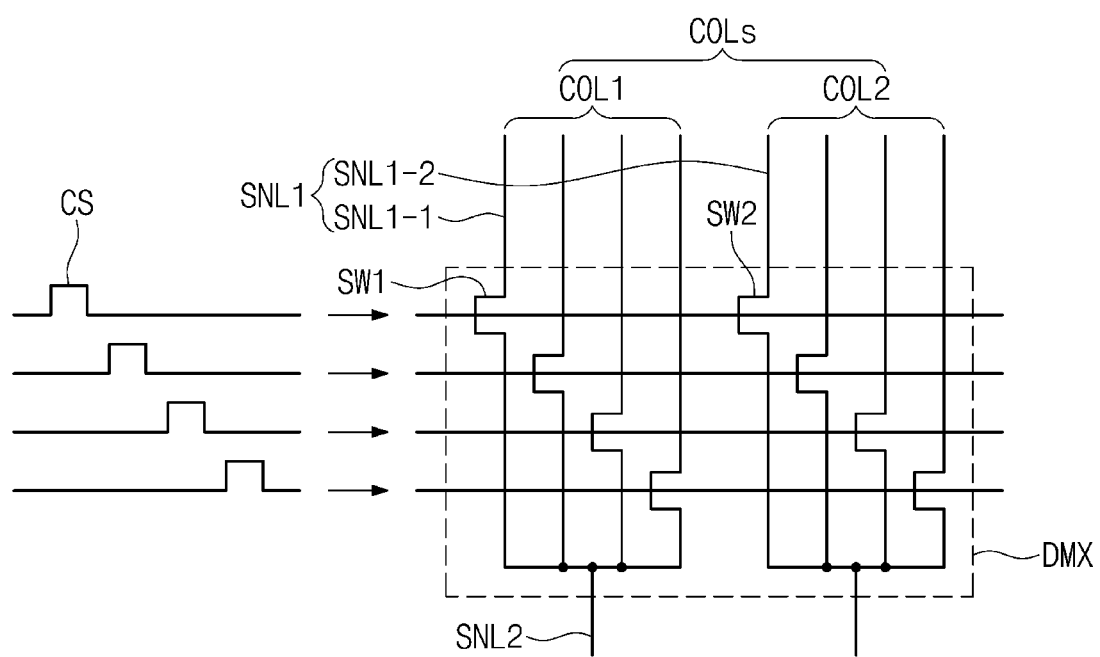
FIG. 17 shows a configuration of a demultiplexer illustrated in FIG. 8.

FIG. 17 shows a configuration of a DEMUX circuit illustrated in FIG. 8.

Referring to FIG. 17, the DEMUX circuit DMX may include a plurality of switching elements SW1 and SW2. Hereinafter, two columns COLs shown in FIG. 8 are divided into a first column COL1 and a second column COL2 in FIG. 17. For example, the first column COL1 indicates the sensing electrodes SNE arranged in a first column in FIG. 8, and the second column COL2 indicates the sensing electrodes SNE arranged in a second column in FIG. 8.

The first sensing lines SNL1 may include a plurality of first sensing lines SL1-1 connected to the sensing electrodes SNE of the first column COL1 and a plurality of second sensing lines SL1-2 connected to the sensing electrodes SNE of the second column COL2.

The switching elements SW1 and SW2 may include a plurality of first switching elements SW1 respectively connected to the first sensing lines SL1-1 and a plurality of second switching elements SW2 respectively connected to the second sensing lines SL1-2. For example, each of the plurality of first switching elements SW1 may be connected to a different one of the plurality of first sensing lines SL1-1, and each of the plurality of second switching elements SW2 may be connected to a different one of the plurality of second sensing lines SL1-2.

First terminals of the first switching elements SW1 may be respectively connected to the first sensing lines SL1-1, and second terminals of the first switching elements SW1 may be commonly connected to one corresponding second sensing line SNL2. Control terminals of the first switching elements SW1 may receive control signals CS.

First terminals of the second switching elements SW2 may be respectively connected to the second sensing lines SL1-2, and second terminals of the second switching elements SW2 may be commonly connected to another corresponding second sensing line SNL2. Control terminals of the second switching elements SW2 may receive the control signals CS.

The control signals CS may be sequentially applied to the first and second switching elements SW1 and SW2. A pair of the first switching element SW1 and the second switching element SW2 may receive the same control signal CS. For example, a pair of the first switching element SW1 and the second switching element SW2 in the same row may receive the same control signal CS.

The first and second switching elements SW1 and SW2 may be sequentially turned on by the control signals CS. The sensing electrodes SNE of the first column COL1 may be sequentially connected to one corresponding second sensing line SNL2 by the first switching elements SW1. In addition, the sensing electrodes SNE of the second column COL2 may be sequentially connected to another corresponding second sensing line SNL2 by the second switching elements SW2.

In other words, The DEMUX circuit DMX may connect, to the two second sensing lines SNL2, two first sensing lines SNL1 among the first sensing lines SNL1 connected to the sensing electrodes CNE arranged in two columns COLs.

Through the first and second sensing lines SNL1 and SNL2 connected to each other by the DEMUX circuit DMX, driving signals are respectively applied to the sensing electrodes SNE, and sensing signals from respective sensing electrodes SNE may be transmitted to the input sensing controller IS-IC.

Figure 18:
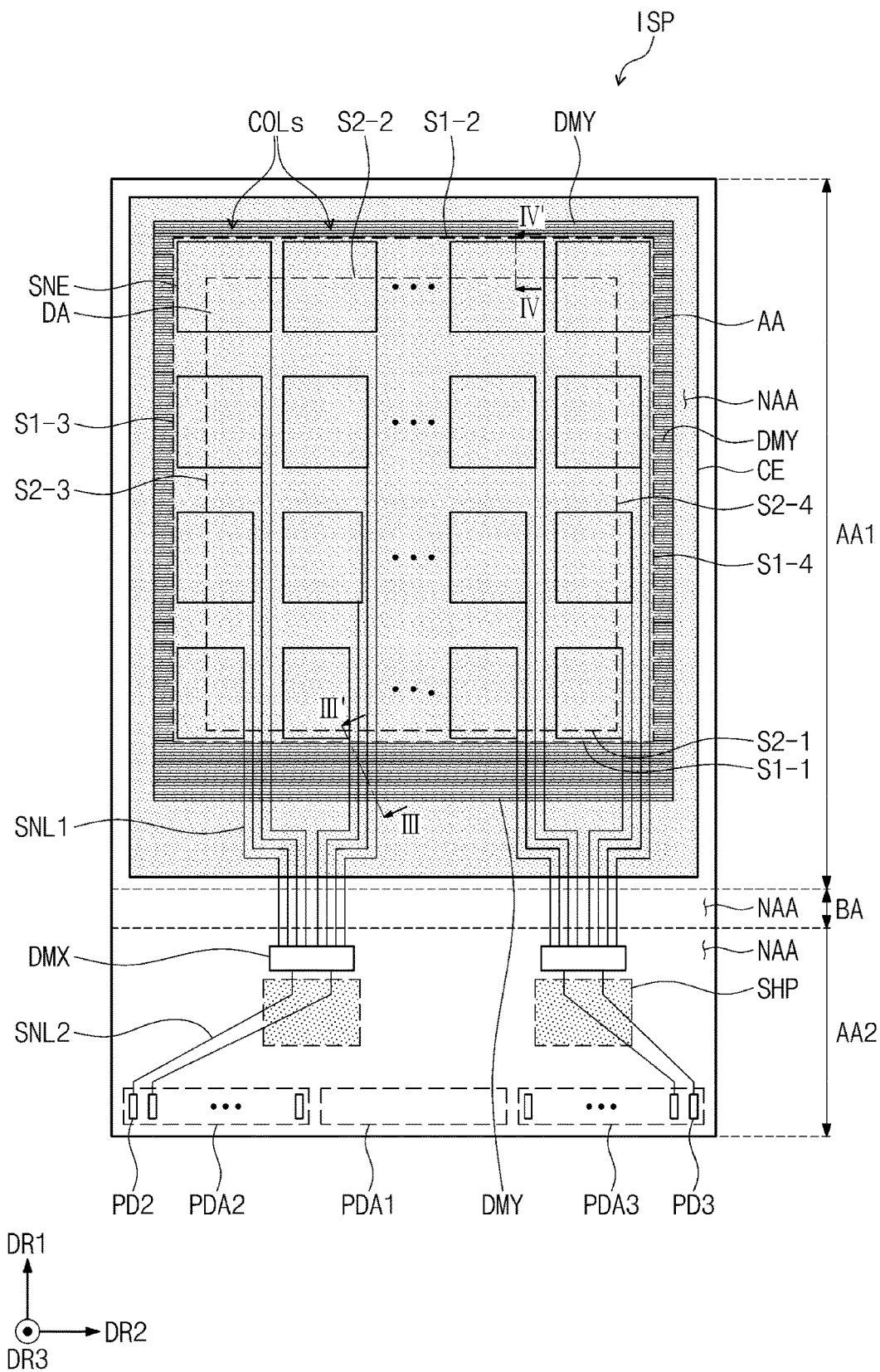
FIG. 18 illustrates a disposition area of a second electrode in FIG. 8.

FIG. 18 additionally illustrates a disposition area of a second electrode in FIG. 8.

Hereinafter, a description will be provided with reference to FIG. 5 as necessary. For example, in FIG. 18, the print layer PIT is omitted in order to more clearly illustrate the second electrode CE. However, the print layer PIT shown in FIG. 8 may be provided together with the second electrode CE shown in FIG. 18. In FIG. 8, the second electrode CE is omitted in order to clearly illustrate the print layer PIT. When viewed on a plane, the print layer PIT illustrated in FIG. 8 may overlap the second electrode CE illustrated in FIG. 18 in the non-active area NAA.

With reference to FIGS. 5 and 18, the second electrode CE may be a box electrode commonly disposed with respect to the pixels PX. The second electrode CE may extend to the outer side of the display area DA. The second electrode CE may extend to the outer side of the active area AA. The second electrode CE may extend to a portion of the non-active area NAA. The second electrode CE may be adjacent to the bending area BA. The second electrode CE may prevent or reduce signal interference between the display panel DP and the input sensing part ISP. A function of the second electrode CE extending to the outer side of the display area DA and the active area AA will be described in detail below.

Figure 19:
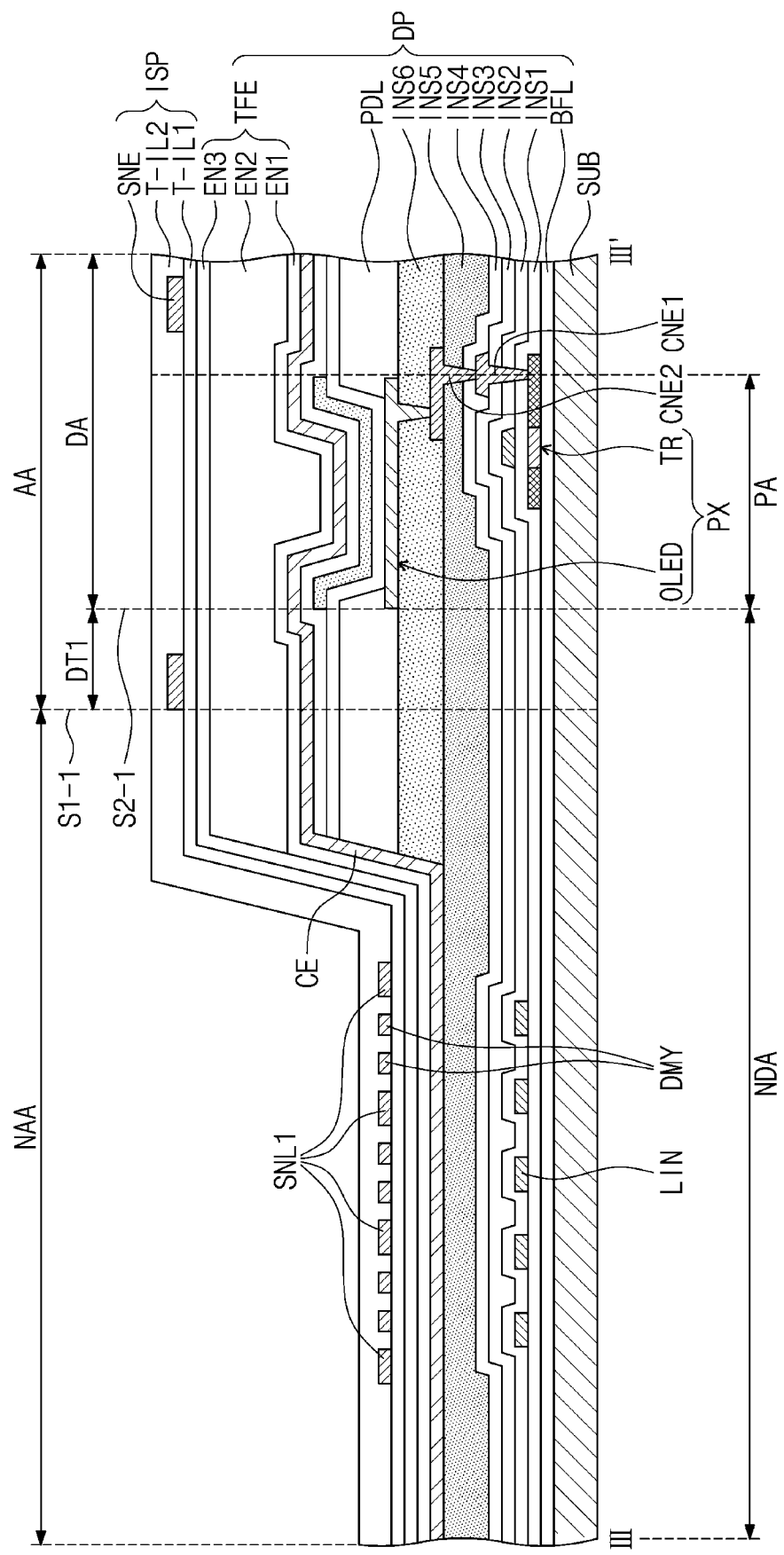
FIG. 19 is a cross-sectional view along line III-III' shown in FIG. 18.

FIG. 19 is a cross-sectional view along line III-III' shown in FIG. 18.

Hereinafter, a description will be provided with reference to FIG. 18 as necessary.

Referring to FIGS. 18 and 19, a pixel PX is disposed on the substrate SUB, and the sensing electrode SNE may be disposed on the pixel PX. The display area DA may be demarcated up to an area in which the outermost light emitting area PA is disposed, and the active area AA may be demarcated up to an area in which the outermost sensing electrode SNE is disposed. According to such a structure, the 1-1 side S1-1 may be separated by the first distance all from the 2-1 side S2-1. A portion of the outermost sensing electrode SNE may be included in the area between the 1-1 side S1-1 and the 2-1 side S2-1.

The cross-sectional structure of the display panel DP and the cross-sectional structure of the input sensing part ISP are specifically described above, and thus descriptions thereabout will be omitted.

The first to fifth insulation layers INS1 to INS5 may extend to the non-display area NDA to be disposed on the substrate SUB. The sixth insulation layer INS6 and the pixel definition layer PDL may be disposed up to a portion adjacent to the display area DA.

A plurality of line patterns LIN may be disposed in the non-display area NDA. The line patterns LIN may be disposed on the first insulation layer INS1, and the second insulation layer INS2 may be disposed on the line patterns LIN. The line patterns LIN may form the first and second control lines CSL1 and CSL2 and the data lines DL1 to DLn illustrated in FIG. 4. The transistor TR may be connected to the line patterns LIN.

The second electrode CE of the light emitting element OLED may extend to the non-display area NDA to be disposed on the fifth insulation layer INS5. The second electrode CE may extend to the non-active area NAA. The first sensing lines SNL1 may be disposed on the second electrode CE. Accordingly, when viewed from a hierarchical structure, the second electrode CE may be disposed between the first sensing lines SNL1 and the line patterns LIN. The dummy patterns DMY may be disposed between the first sensing lines SNL1 on the second electrode CE.

When the pixel PX is driven, signals may be applied to the transistor TR through the line patterns LIN. The signals applied to the line patterns LIN may influence signals to be applied to the first sensing lines SNL1. Due to this signal interference, a noise may be generated in the input sensing part ISP.

However, in an embodiment of the inventive concept, the second electrode CE may be disposed between the first sensing lines SNL1 and the line patterns LIN to block such signal interference. As the result, the noise in the input sensing part ISP may be reduced.

Figure 20:
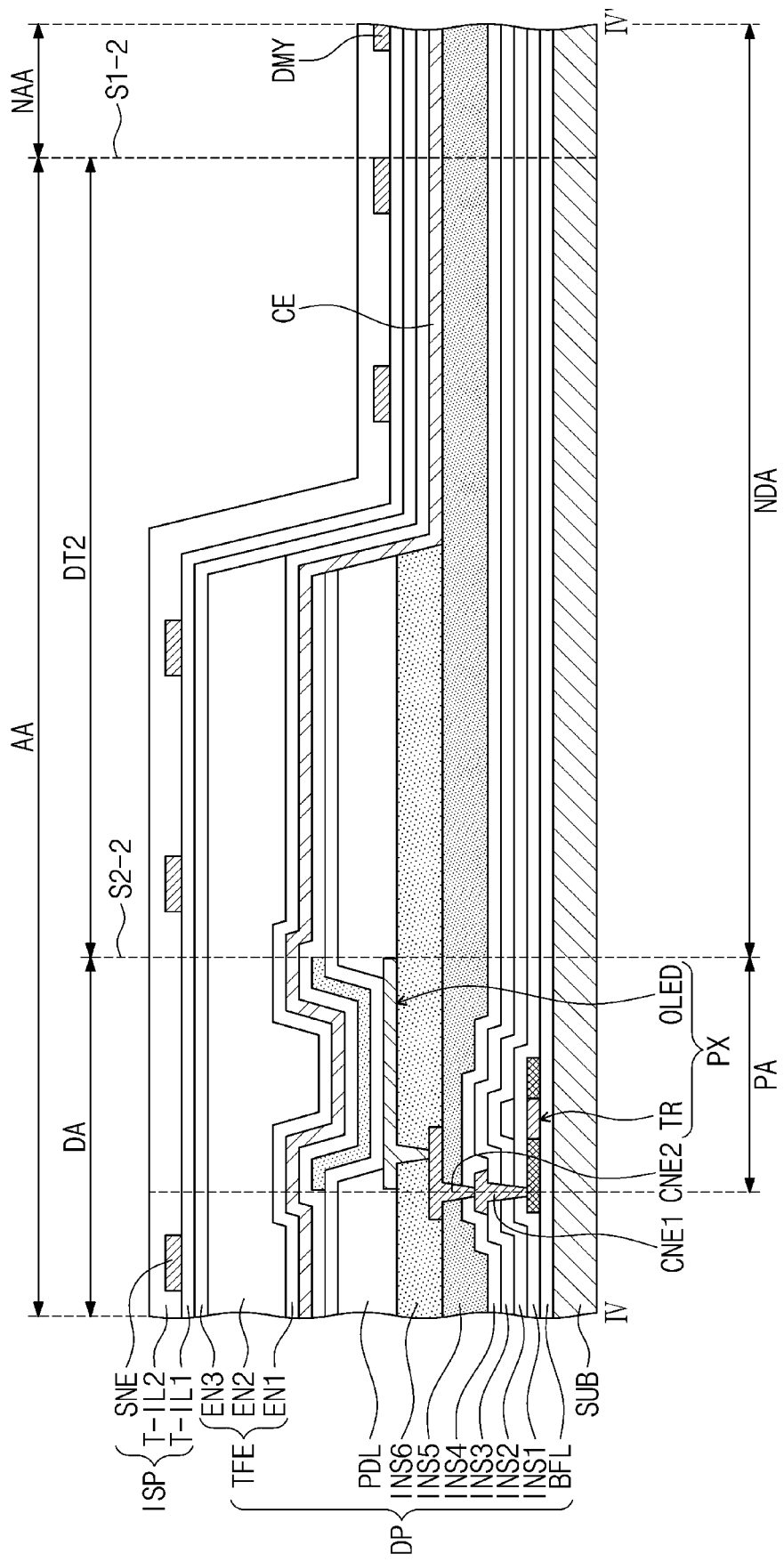
FIG. 20 is a cross-sectional view along line IV-IV' illustrated in FIG. 18.

FIG. 20 is a cross-sectional view along line IV-IV' illustrated in FIG. 18.

Hereinafter, a description will be provided with reference to FIGS. 18 and 19 as necessary.

Referring to FIGS. 18, 19 and 20, the display area DA may be demarcated up to an area in which the outermost light emitting area PA is disposed, and the active area AA may be demarcated up to an area in which the outermost sensing electrode SNE is disposed. The 1-2 side S1-2 may be separated by a second distance DT2 from the 2-2 side S2-2. The 1-2 side S1-2 may be farther from the boundary of the display area DA than the 1-1 side S1-1.

The second electrode CE may extend to the non-display area NDA to be disposed on the fifth insulation layer INS5. The second electrode CE may extend to the non-active area NAA. Portions of the sensing electrodes SNE disposed to the outer side of the display area DA may be disposed on the second electrode CE.

Figure 21:
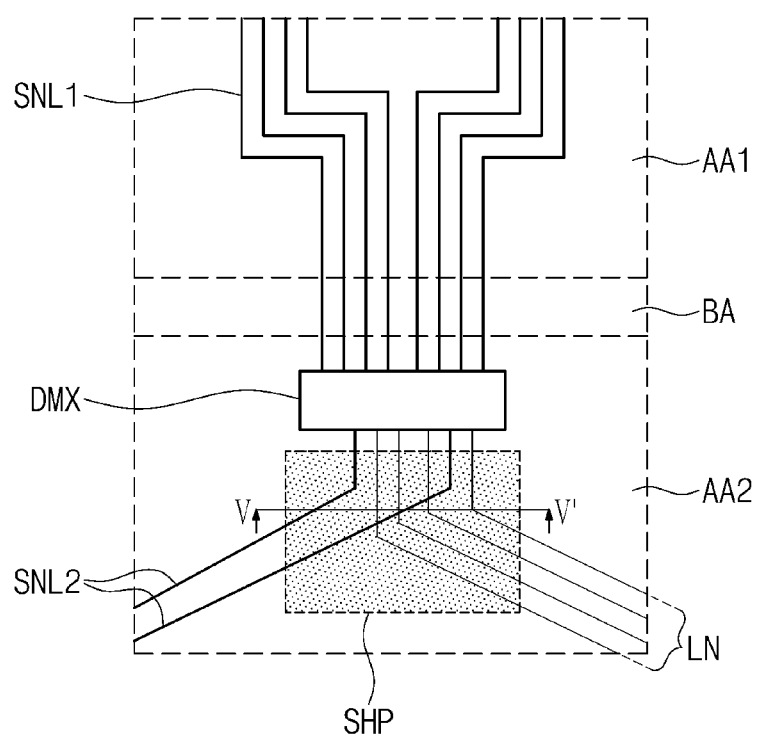
FIG. 21 illustrates lines and second sensing lines adjacent to the demultiplexer illustrated in FIG. 8.

FIG. 21 illustrates lines and the second sensing lines adjacent to the DEMUX illustrated in FIG. 8.

Referring to FIG. 21, the second sensing liens SNL2 and the lines LN adjacent to the DEMUX circuit DMX may extend to cross with each other. The lines LN may extend from the line patterns LIN illustrated in FIG. 19. The lines LN may be a portion of the lines of the display panel DP disposed in the second area AA2 in FIG. 4. In other words, the lines LIN may be disposed in the non-display area NDA to be connected to the pixels PX.

A shield pattern SHP may be disposed adjacent to the DEMUX circuit DMX, and, when viewed on a plane, overlap the second sensing lines SNL2 and the lines LN adjacent to the DEMUX circuit DMX. The shield pattern SHP may overlap the second sensing lines SNL2 and the lines LN that cross with each other.

Figure 22:
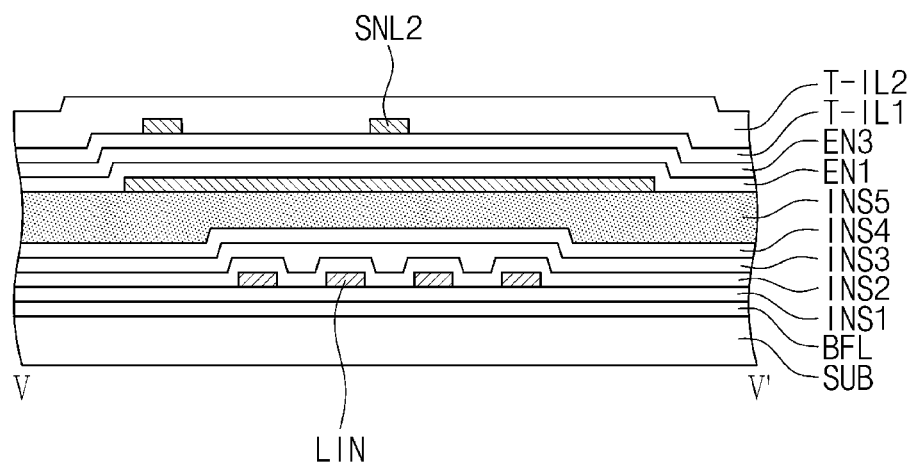
FIG. 22 is a cross-sectional view along line V-V' shown in FIG. 21.

FIG. 22 is a cross-sectional view along line V-V' shown in FIG. 21.

Hereinafter, a description will be provided with reference to FIGS. 5 and 21 as necessary.

Referring to FIGS. 5, 21, and 22, the shield pattern SHP may be disposed between the second sensing lines SNL2 and the lines LN that cross with each other. For example, the second sensing lines SNL2 may be disposed on the lines LN. The shield pattern SHP may be disposed on the lines LN, and the second sensing lines SNL2 may be disposed on the shield pattern SHP. The shield pattern SHP may be disposed between the second sensing lines SNL2 and the lines LN that extend so as to be adjacent to the DEMUX circuit DMX and cross with each other.

The shield pattern SUP may be disposed on the same layer as the second connection electrode CNE2 shown in FIG. 5. However, the shield pattern SHP is not limited hereto, and may be disposed on the same layer as the first connection electrode CNE1 shown in FIG. 5.

The shield pattern SHP may receive the second voltage through the second power line PL2. However, the shield pattern SHP is not limited hereto, and the shield pattern SHP may receive the first voltage through the first power line PL1.

The signals applied to the line patterns LN may influence signals to be applied to the second sensing lines SNL2. The shield pattern SHP may be disposed between the second sensing lines SNL2 and the lines LN that cross with each other, and block such signal interference.

According to embodiments of the inventive concept, an active area of the input sensing part may be shifted upward relatively to a display area of the display panel. Accordingly, a non-active area around a lower side of the active area extends to secure an area in which the sensing lines are to be disposed.

While embodiments of the inventive concept have been described, it is understood by one of ordinary skill in the art that variations in form and detail may be made thereto without departing from the spirit and scope of the inventive concept as set forth in the attached claims.

What is claimed is:

1. A display device, comprising:
   a display panel that includes a display area and a plurality of pixels disposed in the display area; and
   an input sensing part disposed on the display panel, wherein the input sensing part includes an active area and a plurality of sensing electrodes disposed in the active area,
   wherein a first distance between a 1-1 side of the active area and a 2-1 side of the display area is smaller than a second distance between a 1-2 side of the active area and a 2-2 side of the display area, wherein the 1-1 side and the 2-1 side are adjacent to each other and the 1-2 side and the 2-2 side are adjacent to each other, and
   the 1-1 side and the 1-2 side are opposite to each other in a first direction, and the 2-1 side and the 2-2 side are opposite to each other in the first direction.

2. The display device of claim 1, wherein the first distance is smaller than a third distance between a 1-3 side of the active area and a 2-3 side of the display area, and a fourth distance between a 1-4 side of the active area and a 2-4 side of the display area, wherein the 1-3 side and the 2-3 side are adjacent to each other, and the 1-4 side and the 2-4 side are adjacent to each other, and
   the 1-3 side and the 1-4 side are opposite to each other in a second direction intersecting with the first direction, and the 2-3 side and the 2-4 side are opposite to each other in the second direction.

3. The display device of claim 2, wherein the second distance is greater than the third distance and the fourth distance.

4. The display device of claim 2, wherein the third distance is equal to the fourth distance.

5. The display device of claim 2, wherein the active area has a larger area than the display area, and an edge of the active area extends beyond the display area.

6. The display device of claim 5, wherein edges of the sensing electrodes adjacent to the 1-2 side are farther from the display area than edges of the sensing electrodes adjacent to the 1-1 side.

7. The display device of claim 5, wherein edges of the sensing electrodes adjacent to the 1-3 side and edges of the sensing electrodes adjacent to the 1-4 side are farther from the display area than edges of the sensing electrodes adjacent to the 1-1 side.

8. The display device of claim 5, wherein edges of the sensing electrodes adjacent to the 1-2 side are farther from the display area than edges of the sensing electrodes adjacent to the 1-3 side and edges of the sensing electrodes adjacent to the 1-4 side.

9. The display device of claim 1, further comprising:
   a print layer around the active area; and
   a plurality of dummy patterns between the print layer and the active area.

10. The display device of claim 9, wherein the dummy patterns are on a same layer as the sensing electrodes.

11. The display device of claim 9, wherein the dummy patterns extend in a second direction intersecting with the first direction and are arranged in the first direction.

12. The display device of claim 9, further comprising:
    a plurality of first sensing lines connected to the sensing electrodes and extending to a non-active area,
    wherein the first sensing lines extend in the first direction, and the dummy patterns are disposed between the first sensing lines.

13. The display device of claim 12, further comprising:
    at least two second sensing lines; and
    a demultiplexer circuit connected to the at least two second sensing lines,
    wherein the demultiplexer circuit is connected to the first sensing lines connected to sensing electrodes arranged in at least two columns.

14. The display device of claim 13, wherein the display panel and the input sensing part are bendable about a bending area between the demultiplexer circuit and the 1-1 side.

15. The display device of claim 14, wherein at least one of the pixels comprises a first electrode, a second electrode, and a light emitting layer between the first electrode and the second electrode,
    wherein the second electrode extends to an outer side of the active area to be adjacent to the bending area.

16. The display device of claim 13, further comprising:
    a shield pattern adjacent to the demultiplexer circuit, and when viewed on a plane, the shield pattern overlaps the second sensing lines.

17. The display device of claim 16, further comprising:
    a plurality of lines connected to the pixels and disposed in a non-display area,
    wherein the second sensing lines are disposed on the lines, and the shield pattern is adjacent to the demultiplexer circuit and between the second sensing lines and the lines.

18. A display device, comprising:
a display panel that includes a display area and a plurality of pixels disposed in the display area; and
an input sensing part disposed on the display panel, wherein the input sensing part includes an active area and a plurality of sensing electrodes disposed in the active area,
wherein the active area comprises a 1-1 side and a 1-2 side opposite to each other in a first direction, and
edges of the sensing electrodes adjacent to the 1-2 side are disposed farther from the display area than edges of the sensing electrodes adjacent to the 1-1 side.

19. The display device of claim 18, wherein the active area comprises a 1-3 side and a 1-4 side opposite to each other in a second direction intersecting with the first direction, and
edges of the sensing electrodes adjacent to the 1-3 side and edges of the sensing electrodes adjacent to the 1-4 side are disposed farther from the display area than edges of the sensing electrodes adjacent to the 1-1 side.

20. The display device of claim 19, wherein edges of the sensing electrodes adjacent to the 1-2 side are disposed farther from the display area than edges of the sensing electrodes adjacent to the 1-3 side and edges of the sensing electrodes adjacent to the 1-4 side.

21. A display device, comprising:
a display panel including a display area and a plurality of pixels disposed in the display area, wherein the display area includes first and second sides facing each other in a first direction, and third and fourth sides facing each other in a second direction crossing the first direction; and
an input sensing part disposed on the display panel, wherein the input sensing part includes an active area and a plurality of sensing electrodes disposed in the active area, wherein the active area includes fifth and sixth sides facing each other in the first direction, and seventh and eighth sides facing each other in the second direction,
wherein a first distance between the first side of the display area and the fifth side of the active area, which are adjacent to each other, is less than a second distance between the second side of the display area and the sixth side of the active area, which are adjacent to each other.

22. The display device of claim 21, wherein a portion of the sensing electrodes between the first side of the display area and the fifth side of the active area is less than a portion of the sensing electrodes between the second side of the display area and the sixth side of the active area.

23. The display device of claim 21, wherein an edge of a first sensing electrode adjacent to the sixth side of the active area is disposed farther from the display area than an edge of a second sensing electrode adjacent to the fifth side of the active area, wherein the first and second sensing electrodes are arranged in a same column.

24. The display device of claim 21, wherein the first distance is measured along the first direction and the second distance is measured along the first direction.

* * * * *